(12) United States Patent
Poon et al.

(10) Patent No.: US 11,721,651 B2
(45) Date of Patent: Aug. 8, 2023

(54) COMMUNICATION BETWEEN INTEGRATED CIRCUIT (IC) DIES IN WAFER-LEVEL FAN-OUT PACKAGE

(71) Applicant: XILINX, INC., San Jose, CA (US)

(72) Inventors: Chi Fung Poon, Sunnyvale, CA (US); Asma Laraba, San Jose, CA (US); Parag Upadhyaya, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 336 days.

(21) Appl. No.: 17/037,363

(22) Filed: Sep. 29, 2020

(65) Prior Publication Data

US 2022/0102293 A1    Mar. 31, 2022

(51) Int. Cl.
*H01L 23/66* (2006.01)
*H01L 23/538* (2006.01)
*H01L 25/16* (2023.01)

(52) U.S. Cl.
CPC .......... *H01L 23/66* (2013.01); *H01L 23/5386* (2013.01); *H01L 25/16* (2013.01); *H01L 2224/02379* (2013.01)

(58) Field of Classification Search
CPC ..... H01L 23/66; H01L 23/5386; H01L 25/16; H01L 2224/02379; H01L 23/552; H01L 24/20; H01L 2224/04105; H01L 2224/12105; H01L 2224/24137; H01L 2924/1433; H01L 2924/1434; H01L 2924/18162; H01L 2924/3025; H03K 19/17796

(Continued)

(56) References Cited

U.S. PATENT DOCUMENTS

2006/0082403 A1    4/2006   Kase
2006/0184817 A1    8/2006   Dreps et al.
(Continued)

FOREIGN PATENT DOCUMENTS

EP    3139551 A1    3/2017

OTHER PUBLICATIONS

Dehlaghi, Behzad, "A 0.3 pJ/bit 20 Gb/s/Wire Parallel Interface for Die-to-Die Communication," IEEE Journal of Solid-State Circuits, vol. 51, No. 11, Nov. 2016, 12 pages.
(Continued)

*Primary Examiner* — Fitwi Y Hailegiorgis
(74) *Attorney, Agent, or Firm* — Patterson + Sheridan, LLP

(57) ABSTRACT

Examples described herein generally relate to communication between integrated circuit (IC) dies in a wafer-level fan-out package. In an example, an electronic device includes a wafer-level fan-out package. The wafer-level fan-out package includes a first integrated circuit (IC) die, a second IC die, and a redistribution structure. The first IC die includes a transmitter circuit. The second IC die includes a receiver circuit. The redistribution structure includes physical channels electrically connected to and between the transmitter circuit and the receiver circuit. The transmitter circuit is configured to transmit multiple single-ended data signals and a differential clock signal through the physical channels to the receiver circuit. The receiver circuit is configured to capture data from the multiple single-ended data signals using a first single-ended clock signal based on the differential clock signal.

20 Claims, 10 Drawing Sheets

(58) Field of Classification Search
USPC .......................................................... 375/219
See application file for complete search history.

(56) References Cited

U.S. PATENT DOCUMENTS

| | | | |
|---|---|---|---|
| 2006/0256880 A1 | 11/2006 | Frisch | |
| 2012/0087452 A1* | 4/2012 | Zerbe | H03K 5/1252 375/354 |
| 2013/0290766 A1* | 10/2013 | Nguyen | G06F 1/12 713/400 |
| 2017/0229436 A1 | 8/2017 | Yu et al. | |

OTHER PUBLICATIONS

Turner et al., "Ground-Referenced Signaling for Intra-Chip and Short-Reach Chip-to-Chip Interconnects," 2018 IEEE custom integrated Circuits Conference (CICC), 8 pages.

* cited by examiner

COMMUNICATION BETWEEN INTEGRATED CIRCUIT (IC) DIES IN WAFER-LEVEL FAN-OUT PACKAGE

GOVERNMENT RIGHTS

This invention was made with U.S. Government support under Agreement No. HR0011-19-3-0004 awarded by the Defense Advanced Research Projects Agency. The U.S. Government has certain rights in the invention.

TECHNICAL FIELD

Examples of the present disclosure generally relate to communication between integrated circuit (IC) dies in a wafer-level fan-out package.

BACKGROUND

Recently, it has been observed that Moore's law has been slowing down. This slow down has pushed integration of complex systems from system-on-chips (SoCs) to multi-chip module (MCMs) in which different integrated circuit (IC) dies (or chips) are integrated inside the same IC package. The advantages of a MCM includes enabling heterogeneous integration of IC dies of different process nodes and improving yield by incorporating smaller IC dies that have a lower probability of having defects.

Generally, IC dies within a MCM need to communicate with each other. A footprint of the MCM and thermal constraints push for the need for high density, high bandwidth, and lower power short reach links for die-to-die communication. The ever increasing data traffic in such die-to-die communication can make achieving such short reach links for the die-to-die communication more challenging.

Signaling techniques, such as single-ended and chord signaling, have been used in die-to-die transceivers to improve bandwidth density compared to traditional differential signaling. In theory, a pin efficient signaling scheme can also be more power efficient since an amount of capacitive load needed to be driven is reduced. However, the effectiveness of this signaling scheme is highly dependent on the signal-to-noise ratio (SNR) of the received signal. Hence, this signaling scheme can be extremely channel dependent.

Another area that can limit the bandwidth density and energy efficiency is packaging technology. Organic substrates that most MCMs use as interconnects usually have a relatively large line width and spacing, which can limit the achievable bandwidth density and energy efficiency.

SUMMARY

Examples described herein generally relate to communication between integrated circuit (IC) dies in a wafer-level fan-out package. Various examples can achieve communications and/or corresponding structures that are power efficient and have high bandwidth density.

An example described herein is an electronic device that includes a wafer-level fan-out package. The wafer-level fan-out package includes a first integrated circuit (IC) die, a second IC die, and a redistribution structure. The first IC die includes a transmitter circuit. The second IC die includes a receiver circuit. The redistribution structure includes physical channels electrically connected to and between the transmitter circuit and the receiver circuit. The transmitter circuit is configured to transmit multiple single-ended data signals and a differential clock signal through the physical channels to the receiver circuit. The receiver circuit is configured to capture data from the multiple single-ended data signals using a first single-ended clock signal based on the differential clock signal.

Another example described herein is an electronic device. The electronic device includes a first transceiver circuit in a first IC die, a second transceiver circuit in a second IC die, and physical channels. The first IC die is disposed in a wafer-level fan-out package. The second IC die is disposed in the wafer-level fan-out package. The physical channels are in a redistribution structure of the wafer-level fan-out package. The first transceiver circuit is configured to transmit multiple first single-ended data signals and a first differential clock signal through a first subset of the physical channels to the second transceiver circuit. The second transceiver circuit is configured to transmit multiple second single-ended data signals and a second differential clock signal through a second subset of the physical channels to the first transceiver circuit. The second transceiver circuit is configured to capture data from the multiple first single-ended data signals using a first single-ended clock signal based on the first differential clock signal. The first transceiver circuit is configured to capture data from the multiple second single-ended data signals using a second single-ended clock signal based on the second differential clock signal.

Another example described herein is a method of operating an electronic device. A differential clock signal is generated based on a first single-ended clock signal by a single-ended-to-differential converter circuit of a first transceiver circuit of a first IC die. The first IC die is disposed in a wafer-level fan-out package. Parallel data is serialized based on the first single-ended clock signal by a serializer circuit of the first transceiver circuit. Serialized data from the serializer circuit and the differential clock signal are transmitted, through physical channels of the wafer-level fan-out package, to a second transceiver circuit of a second IC die. The second IC die is disposed in the wafer-level fan-out package. The serialized data is deserialized based on the differential clock signal by a deserializer circuit of the second transceiver circuit.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
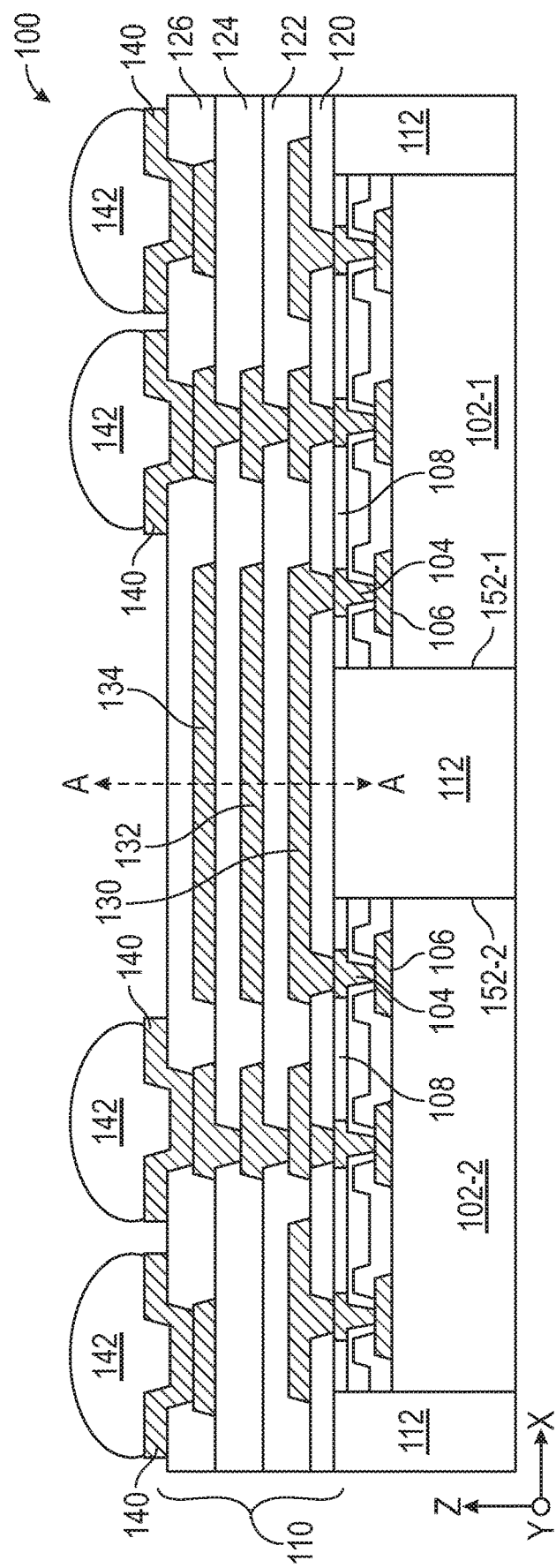
FIG. 1 is a cross-sectional view of an example multiple die wafer-level fan-out (WLFO) package according to some examples.

Examples described herein generally relate to communication between integrated circuit (IC) dies in a wafer-level fan-out package. In some examples, an electronic device includes a wafer-level fan-out package that includes at least two IC dies, where each of the two IC dies includes a transceiver circuit. A transmitter circuit of the transceiver circuit includes a serializer circuit that serializes parallel data based on a single-ended clock signal and outputs, via one or more signal driver circuits, the serialized data through physical channels of a redistribution structure of the wafer-level fan-out package. The transmitter circuit also includes a single-ended-to-differential (S2D) converter circuit that converts the single-ended clock signal to a differential clock signal that the transmitter circuit outputs, via one or more signal driver circuits, through physical channels of the redistribution structure. A receiver circuit of the transceiver circuit includes a differential-to-single-ended (D2S) converter circuit that converts a differential clock signal received from physical channels of the redistribution structure to a single-ended clock signal. The receiver includes a deserializer circuit that deserializes data captured from physical channels of the redistribution structure based on the single-ended clock signal from the D2S converter circuit.

According to some examples, multiple single-ended data signals that are transmitted from a first IC die (e.g., from a transmitter circuit of the transceiver circuit of the first IC die) to a second IC die (e.g., to a receiver circuit of the transceiver circuit of the second IC die) share a differential clock signal. The data communications can therefore be source synchronous. The receiver circuit can omit a clock data recovery (CDR) circuit, which can reduce power consumption in the receiver circuit. The data signals can be single-ended (and further, can be single-ended non-return to zero (NRZ) signals), which can achieve reduced area consumption for physical channels in the redistribution structure of the wafer-level fan-out package and can reduce power consumption since one signal per data signal is transmitted (as opposed to two signals for a differential signal). Further, with multiple single-ended data signals sharing a differential clock signal (e.g., as opposed to each data signal having its own differential clock signal), area consumption can be reduced in the physical channels, and power consumption can be reduced. Generally, various examples can achieve communications and/or corresponding structures that are power efficient and have high bandwidth density. Other benefits can be achieved by other examples.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

In the description that follows, various signals or data are described in the context of the operation of various circuits. A described signal or data indicates a corresponding node on which the signal or data is applied or propagated and further indicates nodes that are communicatively coupled and/or electrically connected. For example, description of a signal or data output from a first circuit and input to a second circuit indicates an output node of the first circuit (on which the signal or data is output from the first circuit) is communicatively coupled and/or electrically connected to an input node of the second circuit (on which the signal or data is input to the second circuit). Explicit description of such nodes may be omitted in the following description, but a person having ordinary skill in the art will readily understand the presence of the nodes.

FIG. 1 illustrates a cross-sectional view of an example multiple die wafer-level fan-out (WLFO) package 100 according to some examples. The WLFO package 100 may be a multiple die integrated fan-out (InFO) package in some examples. Other configurations of WLFO packages may be implemented in other examples.

The WLFO package 100 includes integrated circuit (IC) dies 102-1, 102-2 (collectively or individually, IC die(s) 102) as illustrated. The WLFO package 100 can include two or more IC dies 102. For example, the WLFO package 100 can additionally include IC dies 102-3, 102-4 as explained below. Each IC die 102 can be or include a processor, an application specific integrated circuit (ASIC), a programmable integrated circuit (e.g., field-programmable gate array (FPGA) or complex programmable logic device (CPLD)), memory die, or the like.

Each of the IC dies 102 has conductive pillars 104 (e.g., metal pillars, such as copper pillars) disposed on conductive pads 106 (e.g., metal pads, such as aluminum pads) that are disposed on the active side of the respective IC die 102. The conductive pillars 104 are at least laterally encapsulated with a dielectric material 108. The conductive pillars 104 are on the active side of the respective IC die 102 to form electrical connections between a redistribution structure 110 and the circuits on the respective IC die 102.

An encapsulant 112 laterally encapsulates the IC dies 102. The encapsulant 112 may be a molding compound, epoxy, or the like. The redistribution structure 110 is on the IC dies 102 and encapsulant 112. The redistribution structure 110 includes dielectric layers 120, 122, 124, 126 with metal pattern layers 130, 132, 134 disposed therein. Each dielectric layer 120, 122, 124, 126 can be, for example, polybenzoxazole (PBO), polyimide, benzocyclobutene (BCB), or the like. Each metal pattern of the metal pattern layers 130, 132, 134 can be or include a metal line and/or via and can be formed on and/or through a respective dielectric layer 120, 122, 124 to a metal pattern of an underlying metal pattern layer 130, 132 or conductive pillar 104. For example, metal pattern layer 130 is disposed on the dielectric layer 120 with at least some of the metal patterns of the metal pattern layer 130 being formed through the dielectric layer 120 to contact respective conductive pillars 104. The dielectric layer 122 is disposed on the metal pattern layer 130 and the dielectric layer 120. Metal pattern layer 132 is disposed on the dielectric layer 122 with at least some of the metal patterns of the metal pattern layer 132 being formed through the dielectric layer 122 to contact respective metal patterns of the metal pattern layer 130. The dielectric layer 124 is disposed on the metal pattern layer 132 and the dielectric layer 122. Metal pattern layer 134 is disposed on the dielectric layer 124 with at least some of the metal patterns of the metal pattern layer 134 being formed through the dielectric layer 124 to contact respective metal patterns of the metal pattern layer 132. The dielectric layer 126 is disposed on the metal pattern layer 134 and the dielectric layer 124. The metal patterns of the metal pattern layers 130, 132, 134 may be or include, for example, copper, titanium, tungsten, aluminum, or the like. Metal patterns of the metal pattern layers 130, 132, 134 in the redistribution structure 110 can interconnect the IC dies 102 and can be used to escape or route connections from the IC dies 102 to under bump metallizations (UBMs) 140 and bumps 142. The redistribution structure 110 can include any number of dielectric layers and metal pattern layers.

The UBMs 140 are formed on and through the outer dielectric layer 126 to metal patterns of the metal pattern layer 134. In some examples, the UBMs 140 can be or include various configurations of metal layers, such as a configuration of chrome/chrome-copper alloy/copper/gold, a configuration of titanium/titanium tungsten/copper, a configuration of copper/nickel/gold, or the like.

Bumps 142 are attached to the UBMs 140. The bumps 142 can be, for example, controlled collapse chip connection (C4) bumps, which may include a conductive material such as solder (e.g., lead-free solder), copper, aluminum, gold, nickel, silver, palladium, tin, the like, or a combination thereof. The bumps 142 may further be attached to a package substrate causing the WLFO package 100 to be attached to the package substrate.

The IC die 102-1 has a lateral sidewall 152-1, and the IC die 102-2 has a lateral sidewall 152-2. The lateral sidewalls 152-1, 152-2 are neighboring and facing each other in the WLFO package 100. The lateral sidewalls 152-1, 152-2 are encapsulated by and adhered to the encapsulant 112. A cross-section A-A is illustrated for orienting subsequent illustrations. XYZ axes are also illustrated for orientation purposes. The cross-section A-A is laterally between the lateral sidewalls 152-1, 152-2 and is through the redistribution structure 110.

Figure 2:
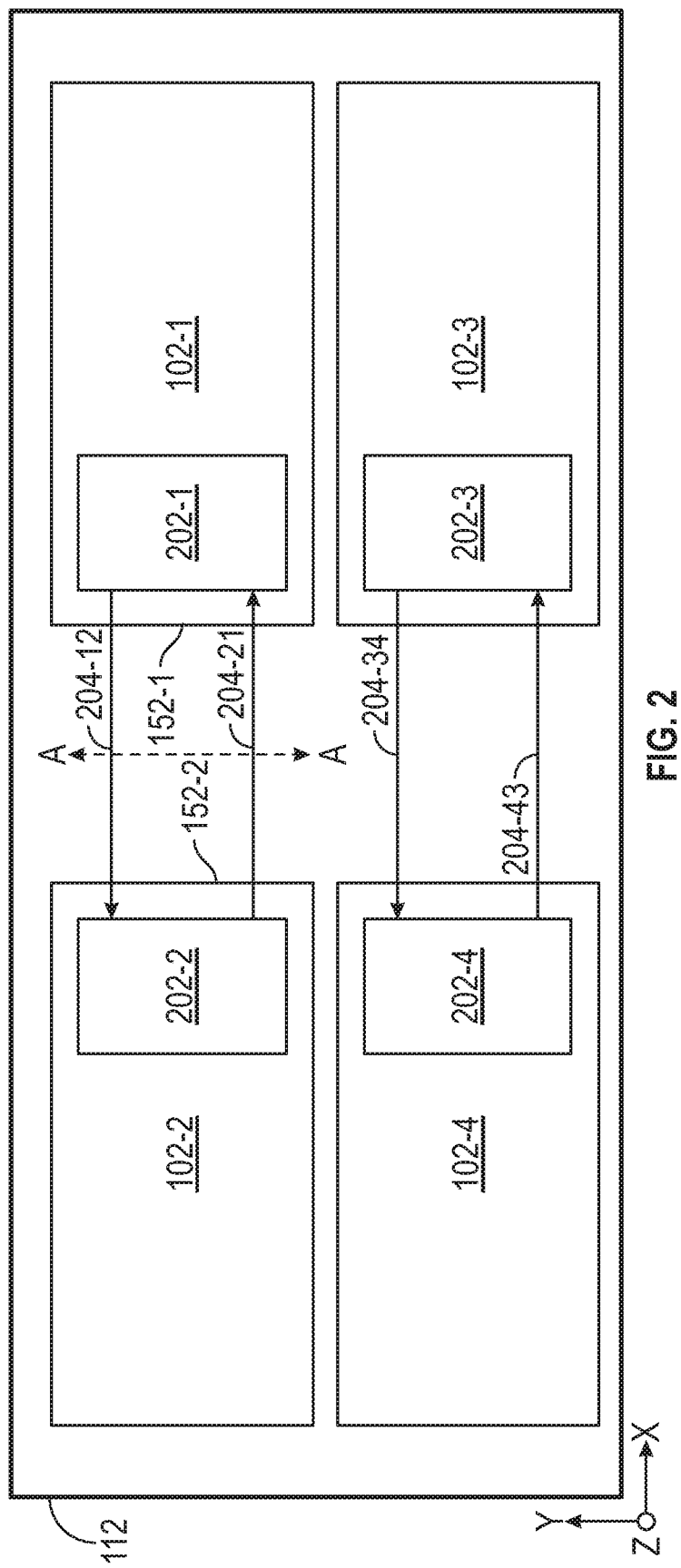
FIG. 2 is a layout of integrated circuit (IC) dies and encapsulant in the WLFO package of FIG. 1 according to some examples.

FIG. 2 depicts a layout of the IC dies 102 and encapsulant 112 in the WLFO package 100 according to some examples. The layout shows IC dies 102-1, 102-2, 102-3, 102-4 laterally encapsulated by the encapsulant 112. The layout further schematically shows transceiver circuits 202-1, 202-2, 202-3, 202-4 (collectively or individually, transceiver circuit(s) 202). A respective transceiver circuit 202 is disposed in each IC die 102. Physical channels 204-12, 204-21, 204-34, 204-43 are schematically depicted. Physical channels 204-12 are from a transmitter circuit of the transceiver circuit 202-1 on the IC die 102-1 to a receiver circuit of the transceiver circuit 202-2 on the IC die 102-2. Physical channels 204-21 are from a transmitter circuit of the transceiver circuit 202-2 on the IC die 102-2 to a receiver circuit of the transceiver circuit 202-1 on the IC die 102-1. Physical channels 204-34 are from a transmitter circuit of the transceiver circuit 202-3 on the IC die 102-3 to a receiver circuit of the transceiver circuit 202-4 on the IC die 102-4. Physical channels 204-43 are from a transmitter circuit of the transceiver circuit 202-4 on the IC die 102-4 to a receiver circuit of the transceiver circuit 202-3 on the IC die 102-3. Other layouts of IC dies and other configurations of physical channels can be implemented in other examples.

The physical channels 204-12, 204-21 include the metal patterns of the metal pattern layers 130, 132, 134 in the redistribution structure 110 that interconnect the IC die 102-1 and the IC die 102-2. The physical channels 204-34, 204-43 include the metal patterns of the metal pattern layers 130, 132, 134 in the redistribution structure 110 that interconnect the IC die 102-3 and the IC die 102-4. In some examples, the physical channels 204-12, 204-21, 204-34, 204-43 do not include a metal pattern (e.g., a metal line) in the metal pattern layer of the redistribution structure 110 that is most distal from the IC dies 102 (e.g., the metal pattern layer 134).

Figure 3:
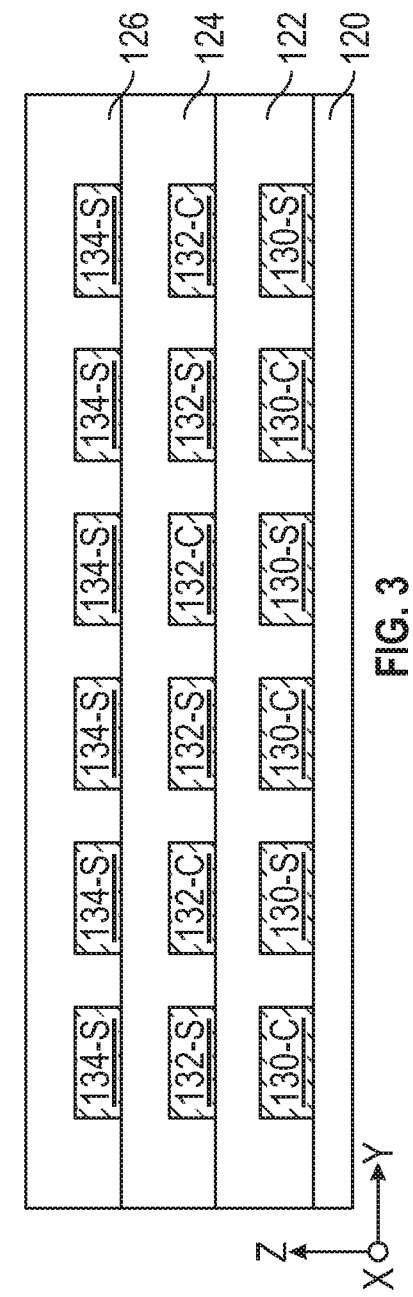
FIG. 3 is a cross-section of the WLFO package of FIG. 1 to illustrate an arrangement of metal patterns for physical channels according to some examples.

FIG. 3 illustrates a cross-section of the WLFO package 100 to illustrate an arrangement of metal patterns for physical channels according to some examples. The cross-section of FIG. 3 is the cross-section A-A in FIGS. 1 and 2. The cross-section in FIG. 3 shows a pattern for channel metal lines and shield metal lines. The metal patterns in the cross-section are, e.g., metal lines extending between the IC dies 102-1, 102-2. The metal pattern layer 130 includes alternating channel metal lines 130-C and shield metal lines 130-S. The metal pattern layer 132 includes alternating channel metal lines 132-C and shield metal lines 132-S. The channel metal lines 130-C, 132-C form a checkerboard pattern with the shield metal lines 130-S, 132-S. The metal pattern layer 134 includes or, in the illustrated cross-section, consists of shield metal lines 134-S.

Each channel metal line 130-C, 132-C in the cross-section forms at least a portion of a physical channel 204-12, 204-21 in some examples. The shield metal lines 130-S, 132-S, 134-S are configured to be electrically connected to a ground potential in operation and/or form a ground node. In other examples, the shield metal lines 130-S, 132-S, 134-S can be configured to be electrically connected to a power supply voltage VDD in operation and/or form a power supply node VDD. Due to the checkerboard pattern, no channel metal line 130-C, 132-C is laterally or vertically directly neighboring another channel metal line 130-C, 132-C. For example, a channel metal line 132-C in FIG. 3 can have a shield metal line 134-S directly above the channel metal line 132-C, a shield metal line 130-S directly below the channel metal line 132-C, and respective shield metal lines 132-S laterally from the channel metal line 132-C. This pattern can reduce cross-talk between channel metal lines, which can reduce cross-talk between physical channels 204-12, 204-21. A person having ordinary skill in the art will readily understand that this pattern can be extended laterally and/or vertically to accommodate any number of physical channels. Such a pattern can be implemented for metal lines extending between the IC dies 102-3, 102-4 for the physical channels 204-34, 204-43.

Figure 4A:
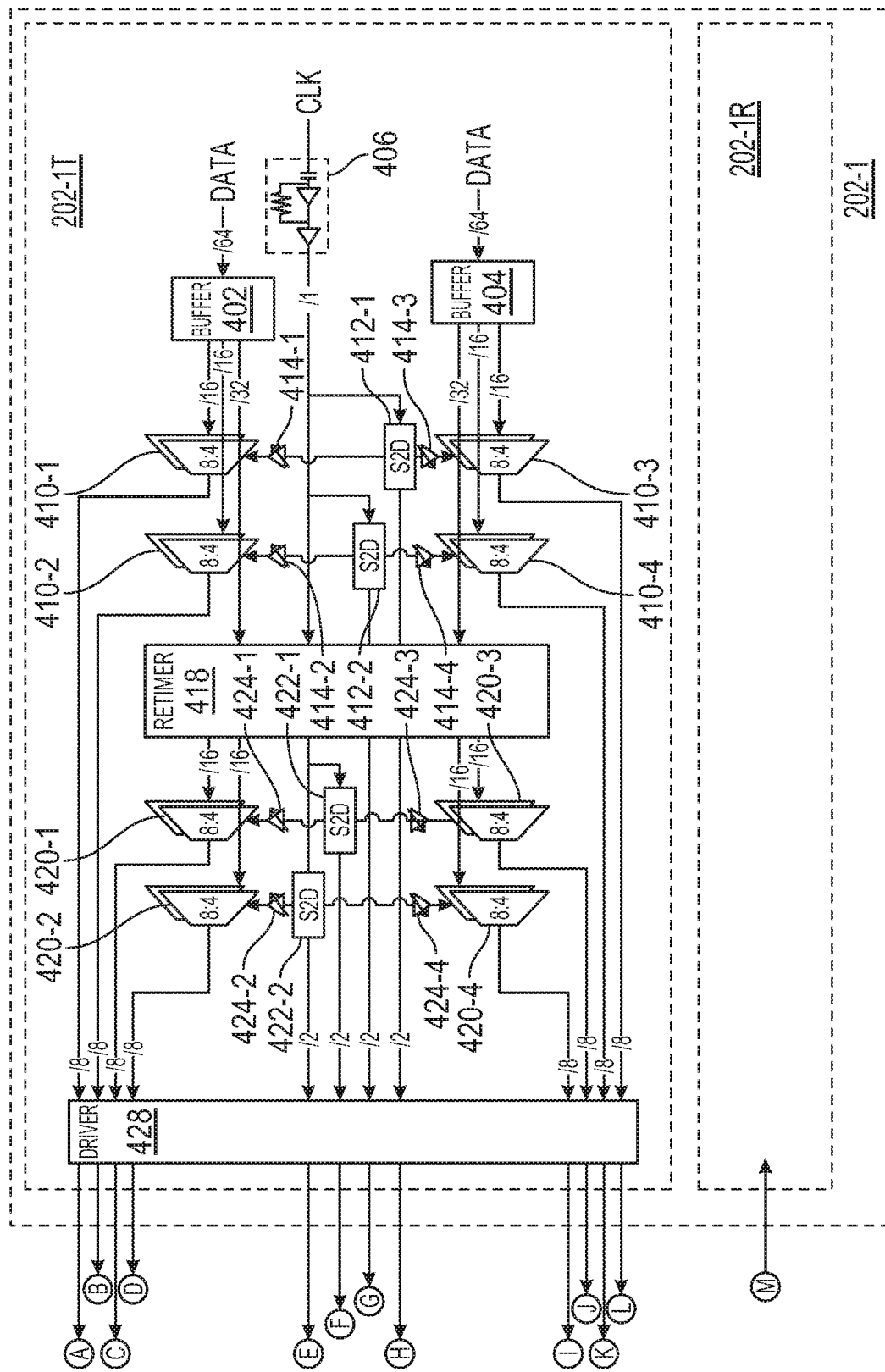
FIGS. 4A and 4B are a circuit schematic of the transceiver circuits communicatively coupled together according to some examples.
Figure 4B:
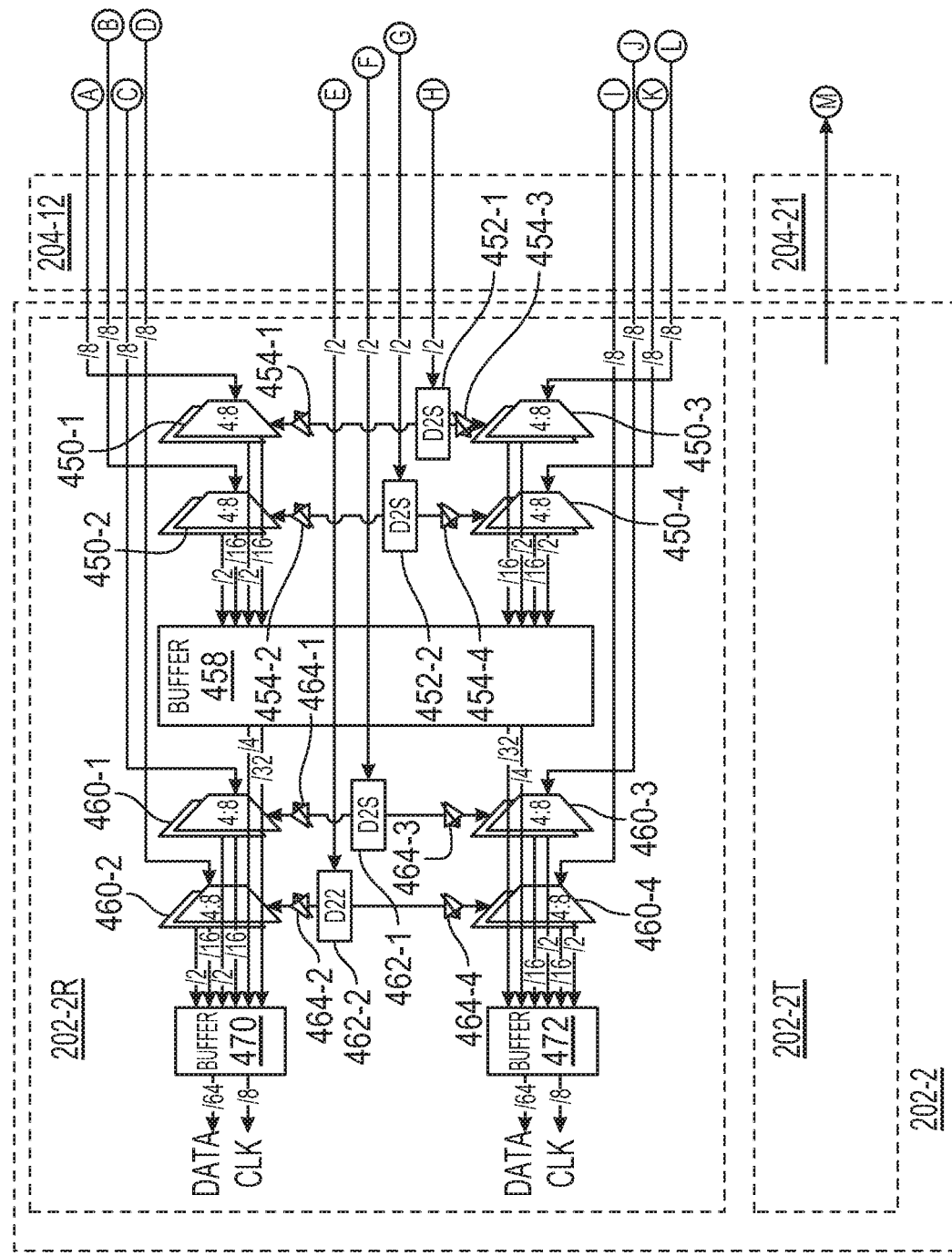

FIGS. 4A and 4B illustrate a circuit schematic of the transceiver circuits 202-1, 202-2 communicatively coupled together according to some examples. A like schematic can be implemented for the transceiver circuits 202-3, 202-4, as a person having ordinary skill in the art will readily understand. FIGS. 4A and 4B shows a transmitter circuit 202-1T of the transceiver circuit 202-1 and a receiver circuit 202-2R of the transceiver circuit 202-2. A receiver circuit 202-1R of the transceiver circuit 202-1 is generally shown, and a transmitter circuit 202-2T of the transceiver circuit 202-2 is generally shown. The transmitter circuit 202-2T can implement a circuit schematic like shown for the transmitter circuit 202-1T; the receiver circuit 202-1R can implement a circuit schematic like shown for the receiver circuit 202-2R; and the transmitter circuit 202-2T and receiver circuit 202-1R can be communicatively coupled like the transmitter circuit 202-1T and receiver circuit 202-2R. A person having ordinary skill in the art will readily understand such an implementation, and as such, detailed description of the transmitter circuit 202-2T and the receiver circuit 202-1R is omitted for brevity.

The circuit schematics illustrated in the following figures are shown and described with details to clearly illustrate and convey aspects of various examples. Other examples can implement a more general application of the illustrated examples without the illustrated details and/or with other details.

The transmitter circuit 202-1T includes buffer circuits 402, 404, a clock driver circuit 406, a first bank of serializer circuits 410-1, 410-2, 410-3, 410-4, a first bank of single-ended-to-differential (S2D) converter circuits 412-1, 412-2, a first bank of clock driver circuits 414-1, 414-2, 414-3, 414-4, a retimer circuit 418, a second bank of serializer circuits 420-1, 420-2, 420-3, 420-4, a second bank of S2D converter circuits 422-1, 422-2, a second bank of clock driver circuits 424-1, 424-2, 424-3, 424-4, and signal driver circuits 428.

The buffer circuits 402 can include, in the illustrated example, sixty-four buffer circuits, where each buffer circuit has an input node electrically connected to a data lane from an interface circuit (not shown) of the IC die 102-1 and an output node electrically connected to a data lane in the transmitter circuit 202-1T. Hence, sixty-four data lanes are shown ("/64") electrically coupled to input nodes of the buffer circuits 402, and a sum of sixty-four data lanes are shown ("/32", "/16", and "/16") electrically coupled to output nodes of the buffer circuits 402. Similarly, the buffer circuits 404 can include, in the illustrated example, sixty-four buffer circuits, where each buffer circuit has an input node electrically connected to a data lane from the interface circuit of the IC die 102-1 and an output node electrically connected to a data lane in the transmitter circuit 202-1T. Hence, sixty-four data lanes are shown ("/64") electrically coupled to input nodes of the buffer circuits 404, and a sum of sixty-four data lanes are shown ("/32", "/16", and "/16") electrically coupled to output nodes of the buffer circuits 402. The buffer circuits 402, 404 are configured to receive parallel data from the respective sixty-four data lanes and output the parallel data to the respective sixty-four data lanes in the transmitter circuit 202-1T.

The clock driver circuit 406, in the illustrated example, includes a capacitor, a resistor, and two buffer circuits. The capacitor has a first terminal electrically connected to a clock node (CLK) from the interface circuit of the IC die 102-1. A second terminal of the capacitor (opposite from the first terminal) is electrically connected to an input node of a first buffer and a first terminal of the resistor. An output node of the first buffer and a second terminal of the resistor (opposite from the first terminal) are electrically connected together and to an input node of a second buffer. An output node of the second buffer is the output node of the clock driver circuit 406. The clock driver circuit 406, in the illustrated example, is configured to receive a single-ended clock signal on the clock node and drive, as an output signal, a single-ended clock signal on a clock lane ("/1").

In the illustrated example, each serializer circuit 410-1, 410-2, 410-3, 410-4, 420-1, 420-2, 420-3, 420-4 includes a pair of 8-to-4 ("8:4") serializers. Each 8-to-4 serializer is configured to receive data from eight data lanes, serialize the received data, and output the serialized data on four data lanes. Each 8-to-4 serializer is configured to serialize the data based on a single-ended clock signal. Other examples can implement different serializer circuits, which may have different ratios of serialization and/or different numbers of serializers.

Each of the serializer circuits 410-1, 410-2 has input nodes electrically connected to respective output nodes of the buffer circuits 402. Hence, each of the serializer circuits 410-1, 410-2 has input nodes electrically connected to data lanes from the buffer circuits 402. In the illustrated example, the serializer circuit 410-1 has input nodes electrically connected to sixteen data lanes ("/16") from the buffer circuits 402, and the serializer circuit 410-2 has input nodes electrically connected to sixteen data lanes ("/16") from the buffer circuits 402.

Each of the serializer circuits 410-3, 410-4 has input nodes electrically connected to respective output nodes of the buffer circuits 404. Hence, each of the serializer circuits 410-3, 410-4 has input nodes electrically connected to data lanes from the buffer circuits 404. In the illustrated example, the serializer circuit 410-3 has input nodes electrically connected to sixteen data lanes ("/16") from the buffer circuits 404, and the serializer circuit 410-4 has input nodes electrically connected to sixteen data lanes ("/16") from the buffer circuits 404.

Each serializer circuit 410-1, 410-2, 410-3, 410-4 has output nodes electrically connected to respective input nodes of the signal driver circuits 428. Hence, the serializer circuits 410-1, 410-2, 410-3, 410-4 each have output nodes electrically connected to data lanes to the signal driver circuits 428. In the illustrated example, each serializer circuit 410-1, 410-2, 410-3, 410-4 has output nodes electrically connected to eight data lanes ("/8") to the signal driver circuits 428.

Each S2D converter circuit 412-1, 412-2, 422-1, 422-2 is configured to receive a single-ended clock signal from a clock lane, generate a differential clock signal from the received single-ended clock signal, and output the differential clock signal. Any single-ended-to-differential converter circuit can be implemented as the S2D converter circuits 412-1, 412-2, 422-1, 422-2.

Each clock driver circuit 414-1, 414-2, 414-3, 414-4, 424-1, 424-2, 424-3, 424-4 is configured to receive a single-ended clock signal, buffer the single-ended clock signal, and output the buffered single-ended clock signal. In some examples, each clock driver circuit 414-1, 414-2, 414-3, 414-4, 424-1, 424-2, 424-3, 424-4 can adjust a duty cycle of the single-ended clock signal, and further, can be programmable to adjust a duty cycle of the single-ended clock signal. Additional details of this programmability and duty cycle adjustment are described subsequently. Although the clock driver circuits 414-1, 414-2, 414-3, 414-4, 424-1, 424-2, 424-3, 424-4 are illustrated independently of the S2D converter circuits and serializer circuits in FIG. 4A, in practice, the clock driver circuits 414-1, 414-2, 414-3, 414-4, 424-1, 424-2, 424-3, 424-4 may be embedded in and/or part of a corresponding S2D converter circuit and/or serializer circuit. Additionally, although a single clock driver circuit is illustrated for a corresponding S2D converter circuit and serializer circuit, multiple clock driver circuits may be implemented for a corresponding S2D converter circuit and serializer circuit.

Each of the S2D converter circuits 412-1, 412-2 has an input node electrically connected to the output node of the clock driver circuit 406. Each of the S2D converter circuits 412-1, 412-2 has the input node electrically connected to the clock lane driven by the clock driver circuit 406. The S2D converter circuit 412-1 includes one or more single-ended output nodes electrically connected to respective input nodes of the clock driver circuits 414-1, 414-3. The S2D converter circuit 412-2 includes one or more single-ended output nodes electrically connected to respective input nodes of the clock driver circuits 414-2, 414-4. The S2D converter circuits 412-1, 412-2 include respective differential output nodes that are electrically connected to respective input nodes of the signal driver circuits 428. Hence, the S2D converter circuits 412-1, 412-2 each have differential output nodes electrically connected to clock lanes to the signal driver circuits 428. In the illustrated example, each S2D converter circuit 412-1, 412-2 has differential output nodes electrically connected to two clock lanes ("/2") to the signal driver circuits 428.

The clock driver circuit 414-1 includes one or more single-ended output nodes that are electrically connected to one or more single-ended clock input nodes of the serializer circuit 410-1. The clock driver circuit 414-2 includes one or more single-ended output nodes that are electrically connected to one or more single-ended clock input nodes of the serializer circuit 410-2. The clock driver circuit 414-3 includes one or more single-ended output nodes that are electrically connected to one or more single-ended clock input nodes of the serializer circuit 410-3. The clock driver circuit 414-4 includes one or more single-ended output nodes that are electrically connected to one or more single-ended clock input nodes of the serializer circuit 410-4. The serializer circuits 410-1, 410-2, 410-3, 410-4 are configured to serialize data using the single-ended clock signal received on the respective single-ended clock input nodes and from the respective clock driver circuit 414-1, 414-2, 414-3, 414-4.

In the illustrated example, as noted above, each serializer circuit 410-1, 410-2, 410-3, 410-4 includes a pair of 8-to-4 ("8:4") serializers. Each 8-to-4 serializer has a clock driver circuit. Hence, each clock driver circuit 414-1, 414-2, 414-3, 414-4 includes, although not explicitly illustrated, two clock driver circuits. The S2D converter circuits 412-1, 412-2 are configured to provide the single-ended clock signal from the clock lane from the clock driver circuit 406 to each of the respective two clock driver circuits of each of the clock driver circuits 414-1, 414-2, 414-3, 414-4. Each clock driver circuit of the clock driver circuits 414-1, 414-2, 414-3, 414-4 is configured to drive the single-ended clock signal, and in some instances, adjust a duty cycle of the single-ended clock signal, to a respective 8-to-4 serializer. For example, the S2D converter circuit 412-1 is configured to provide the single-ended clock signal the two clock driver circuits of the clock driver circuit 414-1, and each of those clock driver circuits can drive a respective single-ended clock signal that is output to a respective one of the 8-to-4 serializer of the serializer circuit 410-1.

The retimer circuit 418 has input nodes electrically connected to respective output nodes of the buffer circuits 402, 404. Hence, the retimer circuit 418 has input nodes electrically connected to data lanes from the buffer circuits 402, 404. In the illustrated example, the retimer circuit 418 has input nodes electrically connected to thirty-two data lanes ("/32") from the buffer circuits 402 and has input nodes electrically connected to thirty-two data lanes ("/32") from the buffer circuits 404. The retimer circuit 418 further has an input node electrically connected to the output node of the clock driver circuit 406. Hence, the retimer circuit 418 has the input node electrically connected to the clock lane driven by the clock driver circuit 406. The retimer circuit 418 can include, e.g., a buffer circuit or driver circuit to further drive the clock signal received from the clock lane, and can include a flip-flop for each data lane connected to an input node of the retimer circuit 418. The clock signal can trigger the flip-flops to re-align data signals received from the data lanes from the buffer circuits 402, 404. The retimer circuit 418 can provide an increase timing margin when banks of serializer circuits are disposed a relatively large distance from the buffer circuits 402, 404, for example.

The retimer circuit 418 has output nodes electrically connected to respective data lanes. In the illustrated example, a sum of sixty-four data lanes are shown ("/16", "/16", "/16", and "/16") electrically coupled to output nodes of the retimer circuit 418. The retimer circuit 418 has an output node electrically connected to a clock lane. In the illustrated example, the clock lane is for a single-ended clock signal.

Each serializer circuit 420-1, 420-2, 420-3, 420-4 has input nodes electrically connected to respective output nodes of the retimer circuit 418. Hence, the respective serializer circuit 420-1, 420-2, 420-3, 420-4 has input nodes electrically connected to data lanes from the retimer circuit 418. In the illustrated example, each serializer circuit 420-1, 420-2, 420-3, 420-4 has input nodes electrically connected to respective sixteen data lanes ("/16") from the retimer circuit 418.

Each serializer circuit 420-1, 420-2, 420-3, 420-4 has output nodes electrically connected to respective input nodes of the signal driver circuits 428. Hence, the serializer circuits 420-1, 420-2, 420-3, 420-4 each have output nodes electrically connected to data lanes to the signal driver circuits 428. In the illustrated example, each serializer circuit 420-1, 420-2, 420-3, 420-4 has output nodes electrically connected to eight data lanes ("/8") to the signal driver circuits 428.

Each of the S2D converter circuits 422-1, 422-2 has an input node electrically connected to an output node of the retimer circuit 418. Each of the S2D converter circuits 422-1, 422-2 has the input node electrically connected to the clock lane driven by the retimer circuit 418. The S2D converter circuit 422-1 includes one or more single-ended output nodes electrically connected to one or more single-ended input nodes of the clock driver circuits 424-1, 424-3. The S2D converter circuit 422-2 includes one or more single-ended output nodes electrically connected to one or more single-ended input nodes of the clock driver circuits 424-2, 424-4. The S2D converter circuits 422-1, 422-2 include respective differential output nodes that are electrically connected to respective input nodes of the signal driver circuits 428. Hence, the S2D converter circuits 422-1, 422-2 each have differential output nodes electrically connected to clock lanes to the signal driver circuits 428. In the illustrated example, each S2D converter circuits 422-1, 422-2 has differential output nodes electrically connected to two clock lanes ("/2") to the signal driver circuits 428.

The clock driver circuit 424-1 includes one or more single-ended output nodes that are electrically connected to one or more single-ended clock input nodes of the serializer circuit 420-1. The clock driver circuit 424-2 includes one or more single-ended output nodes that are electrically connected to one or more single-ended clock input nodes of the serializer circuit 420-2. The clock driver circuit 424-3 includes one or more single-ended output nodes that are electrically connected to one or more single-ended clock input nodes of the serializer circuit 420-3. The clock driver circuit 424-4 includes one or more single-ended output nodes that are electrically connected to one or more single-ended clock input nodes of the serializer circuit 420-4. The serializer circuits 420-1, 420-2, 420-3, 420-4 are configured to serialize data using the single-ended clock signal received on the respective single-ended clock input nodes and from the respective clock driver circuit 424-1, 424-2, 424-3, 424-4. Like noted above for the clock driver circuits 414-1, 414-2, 414-3, 414-4, each clock driver circuit 424-1, 424-2, 424-3, 424-4 includes, although not explicitly illustrated in the illustrated example, two clock driver circuits.

The signal driver circuits 428 have input nodes electrically connected to the data lanes and clock lanes from the various serializer circuits and S2D converter circuits, as described above. The signal driver circuits 428 include a signal driver circuit for each input node, and corresponding lane, and is configured to drive a corresponding signal on a corresponding physical channel of the physical channels 204-12. Each signal driver that drives a data signal (e.g., a signal based on serialized data on a data lane from a serializer circuit) can be configured to drive a single-ended data signal, such as a single-ended NRZ data signal, on a corresponding physical channel. Using such single-ended signaling can reduce the number of physical channels (e.g., metal lines) in the WLFO package 100 and can reduce power consumption compared to differential signaling. Further, each signal driver that drives a clock signal can be configured to drive a differential clock signal on a corresponding pair of physical channels. Each signal driver circuit can be configured to provide equalization for a channel response of the corresponding physical channel that the signal driver circuit is configured to drive. Additionally, the signal driver circuit can be programmable to provide equalization. Additional details of the equalization and programmability are described subsequently.

In operation of the illustrated example, the buffer circuits 402, 404 receive parallel data from respective sixty-four data lanes from the interface circuit of the IC die 102-1. The buffer circuits 402, 404 each output the respective received parallel data on corresponding sixty-four data lanes. Of the parallel data on the sixty-four data lanes from the buffer circuits 402, parallel data on sixteen data lanes is input to the serializer circuit 410-1; parallel data on another sixteen data lanes is input to the serializer circuit 410-2; and parallel data on thirty-two data lanes is input to the retimer circuit 418. Of the parallel data on the sixty-four data lanes from the buffer circuits 404, parallel data on sixteen data lanes is input to the serializer circuit 410-3; parallel data on another sixteen data lanes is input to the serializer circuit 410-4; and parallel data on thirty-two data lanes is input to the retimer circuit 418.

The clock driver circuit 406 receives a single-ended clock signal from the interface circuit of the IC die 102-1, and drives the single-ended clock signal on the clock lane to the S2D converter circuits 412-1, 412-2 and retimer circuit 418. The S2D converter circuits 412-1, 412-2 each generate a differential clock signal from the single-ended clock signal received from the clock lane. The S2D converter circuit 412-1 provides the differential clock signal to the signal driver circuits 428 via two clock lanes and provides the single-ended clock signal from the clock lane to the clock driver circuits 414-1, 414-3. The S2D converter circuit 412-2 provides the differential clock signal to the signal driver circuits 428 via two clock lanes and provides the single-ended clock signal from the clock lane to the clock driver circuits 414-2, 414-4. The clock driver circuits 414-1, 414-2, 414-3, 414-4 buffer the received single-ended clock signal and output the buffered single-ended clock signal to the respective serializer circuit 410-1, 410-2, 410-3, 410-4. In some examples, the clock driver circuits 414-1, 414-2, 414-3, 414-4 can adjust the duty cycle of the received single-ended clock signal to generate the buffered single-ended clock signal.

The retimer circuit 418 receives parallel data from thirty-two data lanes from the buffer circuits 402 and thirty-two data lanes from the buffer circuits 404. The retimer circuit 418 also receives the signal-ended clock signal from the clock lane from the clock driver circuit 406. The retimer circuit 418 can buffer or drive the single-ended clock signal and realign or synchronize the parallel data with the clock signal. The retimer circuit 418 outputs the respective parallel data on corresponding sixty-four data lanes. Of those sixty-four data lanes, parallel data output on thirty-two data lanes correspond to parallel data received on thirty-two data lanes from the buffer circuits 402, and parallel data output on thirty-two data lanes correspond to parallel data received on thirty-two data lanes from the buffer circuits 404. Of the parallel data output on the thirty-two data lanes that correspond to the buffer circuits 402, parallel data on sixteen data lanes is input to the serializer circuit 420-1, and parallel data on another sixteen data lanes is input to the serializer circuit 420-2. Of the parallel data output on the thirty-two data lanes that correspond to the buffer circuits 404, parallel data on sixteen data lanes is input to the serializer circuit 420-3, and parallel data on another sixteen data lanes is input to the serializer circuit 420-4. The retimer circuit 418 drives the single-ended clock signal on the clock lane to the S2D converter circuits 422-1, 422-2.

The S2D converter circuits 422-1, 422-2 each generate a differential clock signal from the single-ended clock signal received from the clock lane from the retimer circuit 418. The S2D converter circuit 422-1 provides the differential clock signal to the signal driver circuits 428 via two clock lanes and provides the single-ended clock signal from the clock lane to the clock driver circuits 424-1, 424-3. The S2D converter circuit 422-2 provides the differential clock signal to the signal driver circuits 428 via two clock lanes and provides the single-ended clock signal from the clock lane to the clock driver circuits 424-2, 424-4. The clock driver circuits 424-1, 424-2, 424-3, 424-4 buffer the received single-ended clock signal and output the buffered single-ended clock signal to the respective serializer circuit 420-1, 420-2, 420-3, 420-4. In some examples, the clock driver circuits 424-1, 424-2, 424-3, 424-4 can adjust the duty cycle of the received single-ended clock signal to generate the buffered single-ended clock signal.

Each serializer circuit 410-1, 410-2, 410-3, 410-4, 420-1, 420-2, 420-3, 420-4 serializes, based on the received single-ended clock signal, the parallel data received on the respective sixteen data lanes and outputs the serialized data on eight data lanes to the signal driver circuits 428. The signal driver circuits 428 drives the respective data or clock signal received from each data or clock lane on a corresponding physical channel of the physical channels 204-12. The signal driver circuits 428 drives the serialized data on each data lane as a respective single-ended data signal (e.g., a single-ended NRZ data signal) on a corresponding physical channel 204-12, and drives a differential clock signal on each pair of clock lanes on a corresponding pair of physical channels. The signal driver circuits 428 can also equalize the signals on the physical channels 204-12.

The receiver circuit 202-2R includes a first bank of deserializer circuits 450-1, 450-2, 450-3, 450-4, a first bank of differential-to-single-ended (D2S) converter circuits 452-1, 452-2, a first bank of clock driver circuits 454-1, 454-2, 454-3, 454-4, buffer circuit 458, a second bank of deserializer circuits 460-1, 460-2, 460-3, 460-4, a second bank of D2S converter circuits 462-1, 462-2, a second bank of clock driver circuits 464-1, 464-2, 464-3, 464-4, and buffer circuits 470, 472.

In the illustrated example, each deserializer circuit 450-1, 450-2, 450-3, 450-4, 460-1, 460-2, 460-3, 460-4 includes a pair of 4-to-8 ("4:8") deserializers. Each 4-to-8 deserializer is configured to receive data from four data lanes, deserialize the received data, and output the deserialized, parallel data on eight data lanes. Each 4-to-8 deserializer is configured to deserialize the data based on a single-ended clock signal. Each 4-to-8 deserializer is further configured to output the single-ended clock signal used to deserialize the data. Other examples can implement different deserializer circuits, which may have different ratios of serialization and/or different numbers of deserializers.

Each deserializer circuit 450-1, 450-2, 450-3, 450-4, 460-1, 460-2, 460-3, 460-4 has input nodes electrically connected to respective physical channels of the physical channels 204-12. In the illustrated example, each deserializer circuit 450-1, 450-2, 450-3, 450-4, 460-1, 460-2, 460-3, 460-4 has input nodes electrically connected to eight physical channels ("/8") of the physical channels 204-12. The physical channels to which input nodes of the deserializer circuit 450-1 are electrically connected carry data signals originating from the serializer circuit 410-1. Hence, deserializer circuit 450-1 is communicatively coupled to the serializer circuit 410-1. Similarly, deserializer circuit 450-2 is communicatively coupled to the serializer circuit 410-2; deserializer circuit 450-3 is communicatively coupled to the serializer circuit 410-3; deserializer circuit 450-4 is communicatively coupled to the serializer circuit 410-4; deserializer circuit 460-1 is communicatively coupled to the serializer circuit 420-1; deserializer circuit 460-2 is communicatively coupled to the serializer circuit 420-2; deserializer circuit 460-3 is communicatively coupled to the serializer circuit 420-3; and deserializer circuit 460-4 is communicatively coupled to the serializer circuit 420-4.

In some examples, the first bank of serializer circuits 410-1, 410-2, 410-3, 410-4 are physically disposed farthest, in the transmitter circuit 202-1T, from the lateral sidewall 152-1 of the IC die 102-1, and the second bank of serializer circuits 420-1, 420-2, 420-3, 420-4 are physically disposed closest, in the transmitter circuit 202-1T, to the lateral sidewall 152-1 of the IC die 102-1. The first bank of deserializer circuits 450-1, 450-2, 450-3, 450-4 are physically disposed closest, in the receiver circuit 202-2R, to the lateral sidewall 152-2 of the IC die 102-2, and the second bank of deserializer circuits 460-1, 460-2, 460-3, 460-4 are physically disposed farthest, in the receiver circuit 202-2R, from the lateral sidewall 152-2 of the IC die 102-2. Hence, banks of serializer circuits are communicatively coupled to banks of deserializer circuits through physical channels 204-12 that can be generally matched and balanced due to a same or similar length of the physical channels 204-12. This matching and balancing can reduce the collective power consumption to drive signals through the physical channels since the load of the physical channels can be collectively reduced.

Each deserializer circuit 450-1, 450-2, 450-3, 450-4 has output nodes electrically connected to respective input nodes of the buffer circuit 458. Hence, the deserializer circuits 450-1, 450-2, 450-3, 450-4 each have output nodes electrically connected to data lanes to the buffer circuit 458. In the illustrated example, each deserializer circuit 450-1, 450-2, 450-3, 450-4 has output nodes electrically connected to sixteen data lanes ("/16") to the buffer circuit 458. Each deserializer circuit 460-1, 460-2 has output nodes electrically connected to respective input nodes of the buffer circuits 470. Hence, the deserializer circuits 460-1, 460-2 each have output nodes electrically connected to data lanes to the buffer circuits 470. In the illustrated example, each deserializer circuit 460-1, 460-2 has output nodes electrically connected to sixteen data lanes ("/16") to the buffer circuits 470. Each deserializer circuit 460-3, 460-4 has output nodes electrically connected to respective input nodes of the buffer circuits 472. Hence, the deserializer circuits 460-3, 460-4 each have output nodes electrically connected to data lanes to the buffer circuits 472. In the illustrated example, each deserializer circuit 460-3, 460-4 has output nodes electrically connected to sixteen data lanes ("/16") to the buffer circuits 472.

Each D2S converter circuit 452-1, 452-2, 462-1, 462-2 is configured to receive a differential clock signal from respective physical channels of the physical channels 204-12, generate a single-ended clock signal from the received differential clock signal, and output the single-ended clock signal. Any differential-to-single-ended converter circuit can be implemented as the D2S converter circuits 452-1, 452-2, 462-1, 462-2.

Each clock driver circuit 454-1, 454-2, 454-3, 454-4, 464-1, 464-2, 464-3, 464-4 is configured to receive a single-ended clock signal, buffer the single-ended clock signal, and output the buffered single-ended clock signal. In some examples, each clock driver circuit 454-1, 454-2, 454-3, 454-4, 464-1, 464-2, 464-3, 464-4 can adjust a duty cycle of the single-ended clock signal, and further, can be programmable to adjust a duty cycle of the single-ended clock signal. In some examples, each clock driver circuit 454-1, 454-2, 454-3, 454-4, 464-1, 464-2, 464-3, 464-4 can deskew the single-ended clock signal, and further, can be programmable to deskew the single-ended clock signal. Additional details of this programmability, duty cycle adjustment, and deskewing are described subsequently. Although the clock driver circuits 454-1, 454-2, 454-3, 454-4, 464-1, 464-2, 464-3, 464-4 are illustrated independently of the D2S converter circuits and deserializer circuits in FIG. 4B, in practice, the clock driver circuits 454-1, 454-2, 454-3, 454-4, 464-1, 464-2, 464-3, 464-4 may be embedded in and/or part of a corresponding D2S converter circuit and/or deserializer circuit. Additionally, although a single clock driver circuit is illustrated for a corresponding D2S converter circuit and deserializer circuit, multiple clock driver circuits may be implemented for a corresponding D2S converter circuit and deserializer circuit.

Each of the D2S converter circuits 452-1, 452-2, 462-1, 462-2 has differential input nodes electrically connected to physical channels of the physical channels 204-12. In the illustrated example, each D2S converter circuit 452-1, 452-2, 462-1, 462-2 has differential input nodes electrically connected to two physical channels ("/2") of the physical channels 204-12. The D2S converter circuit 452-1 includes one or more single-ended output nodes electrically connected to respective input nodes of the clock driver circuits 454-1, 454-3. The D2S converter circuit 452-2 includes one or more single-ended output nodes electrically connected to respective input nodes of the clock driver circuits 454-2, 454-4. The D2S converter circuit 462-1 includes one or more single-ended output nodes electrically connected to respective input nodes of the clock driver circuits 464-1, 464-3. The D2S converter circuit 462-2 includes one or more single-ended output nodes electrically connected to respective input nodes of the clock driver circuits 464-2, 464-4.

The clock driver circuit 454-1 includes one or more single-ended output nodes that are electrically connected to one or more single-ended clock input nodes of the deserializer circuit 450-1. The clock driver circuit 454-2 includes one or more single-ended output nodes that are electrically connected to one or more single-ended clock input nodes of the deserializer circuit 450-2. The clock driver circuit 454-3 includes one or more single-ended output nodes that are electrically connected to one or more single-ended clock input nodes of the deserializer circuit 450-3. The clock driver circuit 454-4 includes one or more single-ended output nodes that are electrically connected to one or more single-ended clock input nodes of the deserializer circuit 450-4. The clock driver circuit 464-1 includes one or more single-ended output nodes that are electrically connected to one or more single-ended clock input nodes of the deserializer circuit 460-1. The clock driver circuit 464-2 includes one or more single-ended output nodes that are electrically connected to one or more single-ended clock input nodes of the deserializer circuit 460-2. The clock driver circuit 464-3 includes one or more single-ended output nodes that are electrically connected to one or more single-ended clock input nodes of the deserializer circuit 460-3. The clock driver circuit 464-4 includes one or more single-ended output nodes that are electrically connected to one or more single-ended clock input nodes of the deserializer circuit 460-4.

In the illustrated example, as noted above, each deserializer circuit 450-1, 450-2, 450-3, 450-4, 460-1, 460-2, 460-3, 460-4 includes a pair of 4-to-8 ("4:8") deserializers. Each 4-to-8 deserializer has a clock driver circuit. Hence, each clock driver circuit 454-1, 454-2, 454-3, 454-4, 464-1, 464-2, 464-3, 464-4 includes, although not explicitly illustrated, two clock driver circuits. The D2S converter circuits 452-1, 452-2, 462-1, 462-2 are configured to generate and provide a single-ended clock signal to each of the respective two clock driver circuits of each of the clock driver circuits 454-1, 454-2, 454-3, 454-4, 464-1, 464-2, 464-3, 464-4. Each clock driver circuit of the clock driver circuits 454-1, 454-2, 454-3, 454-4, 464-1, 464-2, 464-3, 464-4 is configured to drive the single-ended clock signal, and in some instances, deskew the single-ended clock signal and/or adjust a duty cycle of the single-ended clock signal, to a respective 4-to-8 deserializer. For example, the D2S converter circuit 452-1 is configured to provide the single-ended clock signal the two clock driver circuits of the clock driver circuit 454-1, and each of those clock driver circuits can drive a respective single-ended clock signal that is output to a respective one of the 4-to-8 deserializers of the deserializer circuit 450-1.

The deserializer circuits 450-1, 450-2, 450-3, 450-4, 460-1, 460-2, 460-3, 460-4 are configured to deserialize data using the single-ended clock signal received on the respective single-ended clock input node and from the respective clock driver circuit 454-1, 454-2, 454-3, 454-4, 464-1, 464-2, 464-3, 464-4. Each deserializer circuit 450-1, 450-2, 450-3, 450-4 has clock output nodes electrically connected to respective input nodes of the buffer circuit 458. Hence, the deserializer circuits 450-1, 450-2, 450-3, 450-4 each have clock output nodes electrically connected to clock lanes to the buffer circuit 458. In the illustrated example, each deserializer circuit 450-1, 450-2, 450-3, 450-4 has clock output nodes electrically connected to two data lanes ("/2") to the buffer circuit 458. Each deserializer circuit 460-1, 460-2 has clock output nodes electrically connected to respective input nodes of the buffer circuits 470. Hence, the deserializer circuits 460-1, 460-2 each have clock output nodes electrically connected to clock lanes to the buffer circuits 470. In the illustrated example, each deserializer circuit 460-1, 460-2 has clock output nodes electrically connected to two data lanes ("/2") to the buffer circuits 470. Each deserializer circuit 460-3, 460-4 has clock output nodes electrically connected to respective input nodes of the buffer circuits 472. Hence, the deserializer circuits 460-3, 460-4 each have clock output nodes electrically connected to clock lanes to the buffer circuits 472. In the illustrated example, each deserializer circuit 460-3, 460-4 has clock output nodes electrically connected to two data lanes ("/2") to the buffer circuits 472. As noted previously, each deserializer circuit includes a pair of 4-to-8 deserializers, and each of the 4-to-8 deserializers is configured to output the clock signal that the respective 4-to-8 deserializer uses to deserialize the data. Hence, in the illustrated example, each deserializer circuit is shown to output two clock signals to a respective two clock lanes.

The buffer circuit 458 has input nodes electrically connected to respective output nodes of the deserializer circuits 450-1, 450-2, 450-3, 450-4. Hence, the buffer circuit 458 has input nodes electrically connected to data lanes and clock lanes from the deserializer circuits 450-1, 450-2, 450-3, 450-4. In the illustrated example, the buffer circuit 458 has input nodes electrically connected to sixteen data lanes ("/16") and two clock lanes ("/2") from each of the deserializer circuits 450-1, 450-2, 450-3, 450-4. The buffer circuit 458 can include, e.g., a buffer circuit or driver circuit to further drive the data signals and clock signals received from the data lanes and clock lanes, respectively.

The buffer circuit 458 has output nodes electrically connected to respective data lanes and clock lanes. In the illustrated example, a sum of sixty-four data lanes are shown ("/32" and "/32") electrically coupled to output nodes of the buffer circuit 458, and a sum of eight clock lanes are shown ("/4" and "/4") electrically coupled to output nodes of the buffer circuit 458.

The buffer circuits 470 can include, in the illustrated example, seventy-two buffer circuits, where each buffer circuit has an input node electrically connected to a data lane or a clock lane from the deserializer circuits 460-1, 460-2 or buffer circuit 458 and an output node electrically connected to an interface circuit (not shown) of the IC die 102-2. Hence, a sum of sixty-four data lanes are shown ("/32", "/16", and "/16") electrically coupled to input nodes of the buffer circuits 470, and sixty-four data lanes are shown ("/64") electrically coupled to output nodes of the buffer circuits 470. Further, a sum of eight clock lanes are shown ("/4", "/2", and "/2") electrically coupled to input nodes of the buffer circuits 470, and eight clock lanes are shown ("/8") electrically coupled to output nodes of the buffer circuits 470. Similarly, the buffer circuits 472 can include, in the illustrated example, seventy-two buffer circuits, where each buffer circuit has an input node electrically connected to a data lane or a clock lane from the deserializer circuits 460-3, 460-4 or buffer circuit 458 and an output node electrically connected to the interface circuit of the IC die 102-2. Hence, a sum of sixty-four data lanes are shown ("/32", "/16", and "/16") electrically coupled to input nodes of the buffer circuits 472, and sixty-four data lanes are shown ("/64") electrically coupled to output nodes of the buffer circuits 472. Further, a sum of eight clock lanes are shown ("/4", "/2", and "/2") electrically coupled to input nodes of the buffer circuits 472, and eight clock lanes are shown ("/8") electrically coupled to output nodes of the buffer circuits 472. The buffer circuits 470, 472 are configured to receive parallel data and single-ended clock signals from the respective sixty-four data lanes and eight clock lanes and output the parallel data and single-ended clock signals to the respective sixty-four data lanes and eight clock lanes to the interface circuit of the IC die 102-2.

In operation of the illustrated example, each deserializer circuit 450-1, 450-2, 450-3, 450-4, 460-1, 460-2, 460-3, 460-4 receives single-ended data signals from a respective eight physical channels of the physical channels 204-12, and each D2S converter circuit 452-1, 452-2, 462-1, 462-2 receives a differential clock signal from a respective two physical channels of the physical channels 204-12. Each D2S converter circuit 452-1, 452-2, 462-1, 462-2 converts the received differential clock signal to a single-ended clock signal and provides the single-ended clock signal to respective clock driver circuits 454-1, 454-2, 454-3, 454-4, 464-1, 464-2, 464-3, 464-4. The D2S converter circuit 452-1 provides the single-ended clock signal to the clock driver circuits 454-1, 454-3. The D2S converter circuit 452-2 provides the single-ended clock signal to the clock driver circuits 454-2, 454-4. The D2S converter circuit 462-1 provides the single-ended clock signal to the clock driver circuits 464-1, 464-3. The D2S converter circuit 462-2 provides the single-ended clock signal to the clock driver circuits 464-2, 464-4. The clock driver circuits 454-1, 454-2, 454-3, 454-4, 464-1, 464-2, 464-3, 464-4 buffer the received single-ended clock signal and output the buffered single-ended clock signal to the respective deserializer circuit 450-1, 450-2, 450-3, 450-4, 460-1, 460-2, 460-3, 460-4. In some examples, each clock driver circuit 454-1, 454-2, 454-3, 454-4, 464-1, 464-2, 464-3, 464-4 deskews and/or adjusts a duty cycle of the received single-ended clock signal, and the single-ended clock signal that is output can be deskewed and/or have an adjusted duty cycle.

Each deserializer circuit 450-1, 450-2, 450-3, 450-4, 460-1, 460-2, 460-3, 460-4 captures and deserializes, based on the received single-ended clock signal, the data received from the respective eight physical channels of the physical channels 204-12 and outputs the parallel data on sixteen data lanes to the buffer circuits 458, 470, or 472 and the single-ended clock signal used to deserialize the data on a respective clock lane to the buffer circuits 458, 470, or 472. As noted, in the illustrated example, each deserializer circuit 450-1, 450-2, 450-3, 450-4, 460-1, 460-2, 460-3, 460-4 includes two 4-to-8 deserializers, and each of the 4-to-8 deserializers outputs a single-ended clock signal. Hence, in the illustrated example, each deserializer circuit 450-1, 450-2, 450-3, 450-4, 460-1, 460-2, 460-3, 460-4 outputs two single-ended clock signals on respective clock lanes. Each deserializer circuit 450-1, 450-2, 450-3, 450-4 outputs the parallel data and the single-ended clock signals to the buffer circuits 458. Each deserializer circuit 460-1, 460-2 outputs the parallel data and the single-ended clock signals to the buffer circuits 470. Each deserializer circuit 460-3, 460-4 outputs the parallel data and the single-ended clock signals to the buffer circuits 472.

The buffer circuit 458 receives parallel data from sixteen data lanes and two single-ended clock signals from two clock lanes from each of the deserializer circuits 450-1, 450-2, 450-3, 450-4. The buffer circuit 458 buffers or drives the data and the single-ended clock signals and outputs the respective parallel data and single-ended clock signal on corresponding sixty-four data lanes and eight clock lanes to the buffer circuits 470, 472. Of those sixty-four data lanes and eight clock lanes, parallel data output on thirty-two data lanes and single-ended clock signals on four clock lanes to the buffer circuits 470 correspond to parallel data received on sixteen data lanes and single-ended clock signals on two clock lanes from the deserializer circuit 450-1 and sixteen data lanes and single-ended clock signals on two clock lanes from the deserializer circuit 450-2. Further, of those sixty-four data lanes and eight clock lanes, parallel data output on thirty-two data lanes and single-ended clock signals on four clock lanes to the buffer circuits 472 correspond to parallel data received on sixteen data lanes and single-ended clock signals on two clock lanes from the deserializer circuit 450-3 and sixteen data lanes and single-ended clock signals on two clock lanes from the deserializer circuit 450-4.

The buffer circuits 470, 472 receive parallel data from respective sixty-four data lanes and single-ended clock signals from eight clock lanes and outputs the parallel data and clock signals on corresponding sixty-four data lanes and eight clock lanes to the interface circuit of the IC die 102-2. Of the parallel data on the sixty-four data lanes and single-ended clocks signals on the eight clock lanes input to the buffer circuits 470, parallel data on sixteen data lanes and single-ended clock signals on two clock lanes are input from the deserializer circuit 460-1; parallel data on sixteen data lanes and single-ended clock signals on two clock lanes are input from the deserializer circuit 460-2; and parallel data on thirty-two data lanes and single-ended clock signals on four clock lanes are input from the buffer circuits 458. Of the parallel data on the sixty-four data lanes and single-ended clocks signals on the eight clock lanes input to the buffer circuits 472, parallel data on sixteen data lanes and single-ended clock signals on two clock lanes are input from the deserializer circuit 460-3; parallel data on sixteen data lanes and single-ended clock signals on two clock lanes are input from the deserializer circuit 460-4; and parallel data on thirty-two data lanes and single-ended clock signals on four clock lanes are input from the buffer circuits 458.

In the foregoing example, the receiver circuit 202-2R receives differential clock signals from the transmitter circuit 202-1T and uses the received differential clock signals (by conversion to single-ended clocks signals) to capture data transmitted from the transmitter circuit 202-1T via the physical channels 204-12. Hence, the communications described above are source synchronous communications. Implementing source synchronous communications can obviate implementing a clock data recovery (CDR) circuit in the receiver circuit, which can increase power efficiency.

Additionally in the foregoing example, multiple single-ended data signals are generated and data subsequently captured from those multiple single-ended data signals relative to a single clock signal. In the illustrated example, sixteen single-ended data signals (which are transmitted through sixteen physical channels) share a single clock signal. For example, parallel data is serialized by serializer circuits 410-1, 410-3 based on single-ended clock signals from the S2D converter circuit 412-1, and sixteen single-ended data signals are transmitted on sixteen physical channels from the signal driver circuits 428 based on the serialized data on respective eight data lanes from the serializer circuits 410-1, 410-3. One differential clock signal from the S2D converter circuit 412-1 is transmitted, via the signal driver circuits 428, on two physical channels. The D2S converter circuit 452-1 receives the differential clock signal and generates a single-ended clock signal that is used to capture data by deserializer circuits 450-1, 450-3 from the sixteen single-ended data signals on the sixteen physical channels. Other ratios of data signals to clock signals can be implemented. Using a high ratio of data signals to clock signals can be area efficient for physical channels in the WLFO package 100 and can be power efficient since reduced number of clock signals are implemented per data signal.

More or fewer banks of serializer circuits and corresponding S2D converter circuits and clock driver circuits can be included in a transmitter circuit. A retimer circuit can be included or omitted as appropriate for timing of signals propagated across the transmitter circuit. For example, one or more retimer circuits may be implemented for additional banks included in a transmitter circuit. Similarly, more or fewer banks of deserializer circuits and corresponding D2S converter circuits and clock driver circuits can be included in a receiver circuit. A buffer circuit (like buffer circuit 458) can be included or omitted as appropriate for signals propagated across the receiver circuit with more or fewer banks of deserializer circuits.

Figure 5:
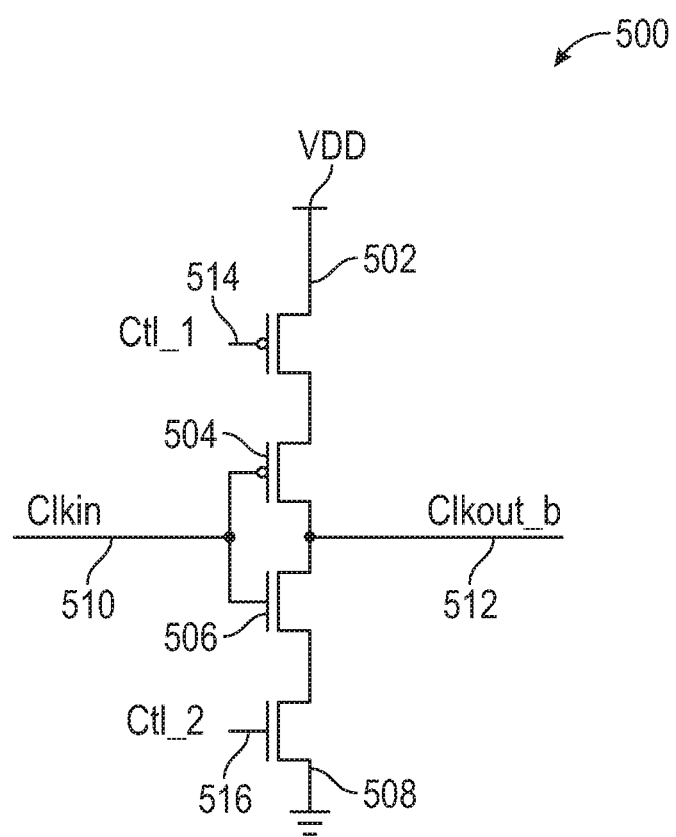
FIG. 5 is a circuit schematic of a clock driver circuit according to some examples.

FIG. 5 is a circuit schematic of a clock driver circuit 500 according to some examples. The clock driver circuit 500 can be implemented as any clock driver circuit in a transmitter circuit of FIGS. 4A and 4B. As noted previously, the clock driver circuit 500 can be a circuit separate from and intervening between a corresponding S2D converter circuit and serializer circuit, or can be embedded in or implemented in a corresponding S2D converter circuit and/or a corresponding serializer circuit. The clock driver circuit 500 is programmable to adjust a duty cycle of a single-ended clock signal.

The clock driver circuit 500 includes p-type transistors 502, 504 (e.g., p-type field effect transistors (FETs)) and n-type transistors 506, 508 (e.g., n-type FETs). A source node of the p-type transistor 502 is electrically connected to a first power supply node (e.g., a VDD power supply node), and a drain node of the p-type transistor 502 is electrically connected to a source node of the p-type transistor 504. A drain node of the p-type transistor 504 is electrically connected to a drain node of the n-type transistor 506, and a source node of the n-type transistor 506 is electrically connected to a drain node of the n-type transistor 508. A source node of the n-type transistor 508 is electrically connected to a second power supply node (e.g., a ground node). Gate nodes of the p-type transistor 504 and the n-type transistor 506 are electrically connected to and/or form at least a portion of an input node 510. The drain nodes of the p-type transistor 504 and the n-type transistor 506 are electrically connected to and/or form at least a portion of an output node 512. A gate node of the p-type transistor 502 is electrically connected to a first control node 514, and a gate node of the n-type transistor 508 is electrically connected to a second control node 516.

A single-ended input clock signal (Clkin), in operation, is input to the clock driver circuit 500 on the input node 510, and a complementary single-ended output clock signal (Clkout_b) is output from the clock driver circuit 500 on the output node 512. Generally, the complementary single-ended output clock signal (Clkout_b) is a logical complement of the single-ended input clock signal (Clkin). Respective control signals (Ctl_1 and Ctl_2), in operation, are applied to the first control node 514 and second control node 516. The control signals bias the clock driver circuit 500 to adjust a switching threshold of the inverter (e.g., the p-type transistor 504 and n-type transistor 506) electrically connected between the p-type transistor 502 and the n-type transistor 508. Adjusting the switching threshold changes when the voltage on the output node 512 (e.g., the complementary single-ended output clock signal (Clkout_b)) transitions from logically low to logically high or from logically high to logically low relative to the voltage on the input node 510 (e.g., the single-ended input clock signal (Clkin)). Hence, using the control signals to bias the clock driver circuit 500 can cause the complementary single-ended output clock signal (Clkout_b) to have an adjusted duty cycle relative to the single-ended input clock signal (Clkin).

In some examples, the first control node 514 and the second control node 516 are electrically connected to an output node of a respective digital-to-analog converter (DAC). The DAC can be electrically coupled to a memory element (e.g., a register, electronic fuses (eFuses), or other memory) that is programmable. The memory element can be programmed or written with a digital value that corresponds to a voltage of the respective control signal (Ctl_1, Ctl_2) applied on the first control node 514 or the second control node 516. The memory element is configured to provide the digital value to the respective DAC, which converts the digital value to an analog voltage that the DAC applies to the respective first control node 514 and second control node 516. Different values programmed or written to the memory element cause different analog voltages to be applied to the respective first control node 514 and second control node 516, which can in turn cause the duty cycle of the single-ended clock to be adjusted differently. Hence, in such examples, the clock driver circuit 500 can be programmable to adjust the duty cycle of the single-ended clock signal.

The clock driver circuit 500 can include additional components in other examples. For example, clock driver circuit 500 can include an inverter that can have an input node electrically connected to the drains of the p-type transistor 504 and the n-type transistor 506 and an output node electrically connected to the output node 512 (e.g., the inverter can be electrically connected between the drains and the output node 512). In such an example, a single-ended output clock signal can generally logically correspond to the single-ended input clock signal (Clkin) (e.g., not be a logical complement of the single-ended input clock signal (Clkin)), possibly with an adjusted duty cycle.

Figure 6:
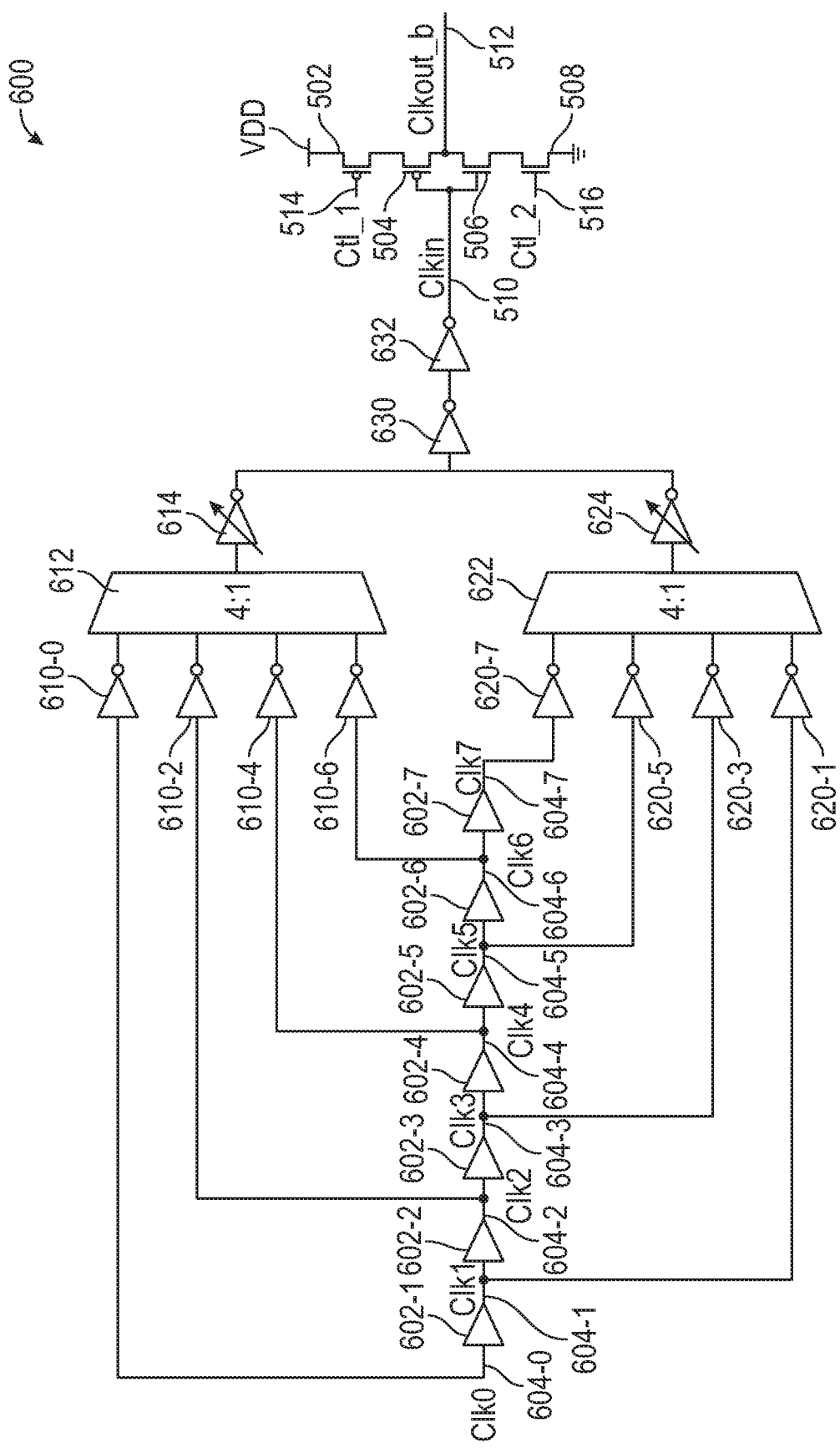
FIG. 6 is a circuit schematic of a clock driver circuit according to some examples.

FIG. 6 is a circuit schematic of a clock driver circuit 600 according to some examples. The clock driver circuit 600 can be implemented as any clock driver circuit in a receiver circuit of FIGS. 4A and 4B. As noted previously, the clock driver circuit 600 can be a circuit separate from and intervening between a corresponding D2S converter circuit and deserializer circuit, or can be embedded in or implemented in a corresponding D2S converter circuit and/or a corresponding deserializer circuit. The clock driver circuit 600 is programmable to deskew and adjust a duty cycle of a single-ended clock signal.

The clock driver circuit 600 includes a deskew stage and a duty cycle adjustment stage. The deskew stage includes buffers 602-1, 602-2, 602-3, 602-4, 602-5, 602-6, 602-7, inverters 610-0, 610-2, 610-4, 610-6, 620-1, 620-3, 620-5, 620-7, 630, 632, multiplexers 612, 622, and programmable inverters 614, 624. The buffers 602-1, 602-2, 602-3, 602-4, 602-5, 602-6, 602-7 are serially connected. An input node of the buffer 602-1 is the input node of the clock driver circuit 600 and is a tap-0 node 604-0. An output node of the buffer 602-1 is a tap-1 node 604-1 and is electrically connected to an input node of the buffer 602-2. An output node of the buffer 602-2 is a tap-2 node 604-2 and is electrically connected to an input node of the buffer 602-3. An output node of the buffer 602-3 is a tap-3 node 604-3 and is electrically connected to an input node of the buffer 602-4. An output node of the buffer 602-4 is a tap-4 node 604-4 and is electrically connected to an input node of the buffer 602-5. An output node of the buffer 602-5 is a tap-5 node 604-5 and is electrically connected to an input node of the buffer 602-6. An output node of the buffer 602-6 is a tap-6 node 604-6 and is electrically connected to an input node of the buffer 602-7. An output node of the buffer 602-7 is a tap-7 node 604-7.

Even tap nodes (e.g., tap-0 node 604-0, tap-2 node 604-2, etc.) are electrically connected to respective input nodes of the inverters 610-0, 610-2, 610-4, 610-6, and odd tap nodes (e.g., tap-1 node 604-1, tap-3 node 604-3, etc.) are electrically connected to respective input nodes of the inverters 620-1, 620-3, 620-5, 620-7. Output nodes of the inverters 610-0, 610-2, 610-4, 610-6 are electrically connected to respective input nodes of the multiplexer 612, and output nodes of the inverters 620-1, 620-3, 620-5, 620-7 are electrically connected to respective input nodes of the multiplexer 622.

More specifically, the tap-0 node 604-0 is electrically connected to the input node of the inverter 610-0, and the output node of the inverter 610-0 is electrically connected to an input node of the multiplexer 612. The tap-2 node 604-2 is electrically connected to the input node of the inverter 610-2, and the output node of the inverter 610-2 is electrically connected to an input node of the multiplexer 612. The tap-4 node 604-4 is electrically connected to the input node of the inverter 610-4, and the output node of the inverter 610-4 is electrically connected to an input node of the multiplexer 612. The tap-6 node 604-6 is electrically connected to the input node of the inverter 610-6, and the output node of the inverter 610-6 is electrically connected to an input node of the multiplexer 612.

The tap-1 node 604-1 is electrically connected to the input node of the inverter 620-1, and the output node of the inverter 620-1 is electrically connected to an input node of the multiplexer 622. The tap-3 node 604-3 is electrically connected to the input node of the inverter 620-3, and the output node of the inverter 620-3 is electrically connected to an input node of the multiplexer 622. The tap-5 node 604-5 is electrically connected to the input node of the inverter 620-5, and the output node of the inverter 620-5 is electrically connected to an input node of the multiplexer 622. The tap-7 node 604-7 is electrically connected to the input node of the inverter 620-7, and the output node of the inverter 620-7 is electrically connected to an input node of the multiplexer 622.

An output node of the multiplexer 612 is electrically connected to an input node of the programmable inverter 614, and output node of the multiplexer 622 is electrically connected to an input node of the programmable inverter 624. An output node of the programmable inverter 614 and an output node of the programmable inverter 624 are electrically connected together and to an input node of the inverter 630. An output node of the inverter 630 is electrically connected to an input node of the inverter 632, and an output node of the inverter 632 is an output node of the deskew stage and is electrically connected to an input node 510 of the duty cycle adjustment stage.

The multiplexers 612, 622 can have respective select control nodes that are electrically coupled to respective memory elements. The memory elements can be programmed or written with digital values that are provided to the select control nodes of the multiplexers 612, 622. The multiplexers 612, 622 can therefore be configured to selectively output a signal that is input on a given input node of the respective multiplexer 612, 622 based on the digital values programmed or written to the memory elements.

Figure 7:
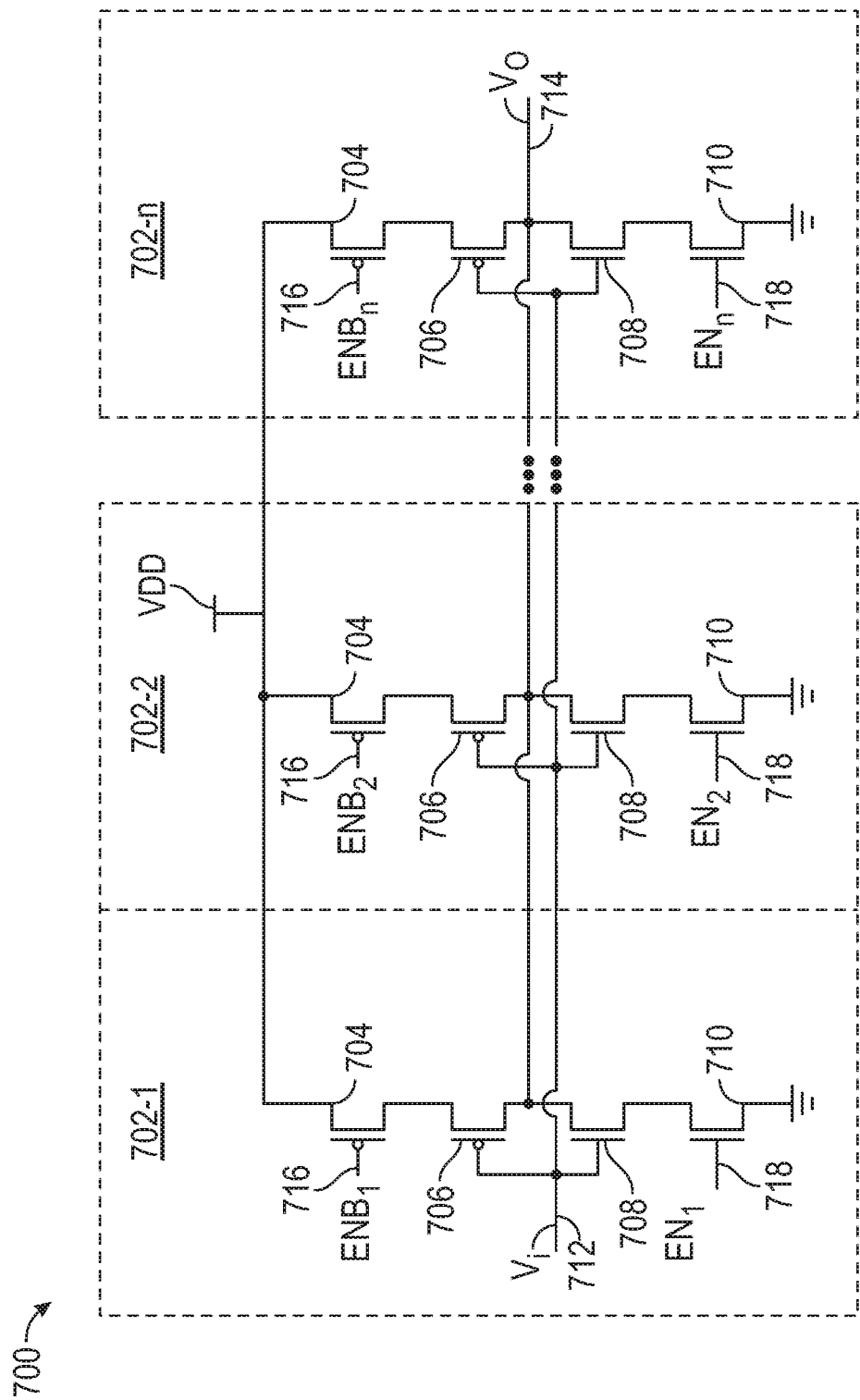
FIG. 7 is a circuit schematic of a programmable inverter according to some examples.

Before describing operation of the illustrated example of FIG. 6, FIG. 7 is a circuit schematic of a programmable inverter 700 according to some examples. Each of the programmable inverters 614, 624 of FIG. 6 may be implemented like the programmable inverter 700 of FIG. 7. The programmable inverter 700 includes n number of inverter stages 702-1, 702-2, . . . 702-n (individually or collectively, inverter stage(s) 702).

Each inverter stage 702 includes p-type transistors 704, 706 and n-type transistors 708, 710. A source node of the p-type transistor 704 is electrically connected to a first power supply node (e.g., a VDD power supply node), and a drain node of the p-type transistor 704 is electrically connected to a source node of the p-type transistor 706. A drain node of the p-type transistor 706 is electrically connected to a drain node of the n-type transistor 708, and a source node of the n-type transistor 708 is electrically connected to a drain node of the n-type transistor 710. A source node of the n-type transistor 710 is electrically connected to a second power supply node (e.g., a ground node). Gate nodes of the p-type transistor 706 and the n-type transistor 708 are electrically connected to and/or form at least a portion of an input node 712. The drain nodes of the p-type transistor 706 and the n-type transistor 708 are electrically connected to and/or form at least a portion of an output node 714. A gate node of the p-type transistor 704 is electrically connected to a respective complementary enable node (ENBx) 716, and a gate node of the n-type transistor 710 is electrically connected to an enable node (ENx) 718, where x indicates the corresponding inverter stage 702 (e.g., x is 1 for inverter stage 702-1).

In some examples, each enable node (ENx) 718 is electrically coupled to a memory element (e.g., a register, eFuse, or other memory) that is programmable. The memory element can be programmed or written with a digital value that is logically high or logically low, and that logically high or logically low value is applied on the respective enable node (ENx) 718 of a given inverter stage 702. An inverter can be electrically coupled between the memory element and the respective complementary enable node (ENBx) 716 of the given inverter stage 702 to logically complement the value programmed or written to the memory element, which logically complemented value is applied to the respective complementary enable node (ENBx) 716.

The inverter stages 702 include inverters that can be selectively operatively coupled in the programmable inverter 700 based on the values written to the memory elements of the inverter stages 702. For a given inverter stage 702-x, when the signal on the enable node (ENx) 718 is logically high (e.g., the power supply voltage VDD) and the signal on the complementary enable node (ENBx) 716 is correspondingly logically low (e.g., a ground potential), the p-type transistor 704 and the n-type transistor 710 are in conductive states, which causes the inverter formed by the p-type transistor 706 and the n-type transistor 708 to be operatively coupled in the programmable inverter 700. Conversely, when the signal on the enable node (ENx) 718 is logically low and the signal on the complementary enable node (ENBx) 716 is correspondingly logically high, the p-type transistor 704 and the n-type transistor 710 are in non-conductive or open states, which causes the inverter formed by the p-type transistor 706 and the n-type transistor 708 to be operatively decoupled in the programmable inverter 700.

By programming a desired number of inverters of the inverter stages 702 to be operatively coupled in the programmable inverter 700, the drivability of the signal output by the programmable inverter 700 can be programmed. Assuming the inverters of each inverter stage 702 has a same drivability (e.g., corresponding transistors 706, 708 have a same width and length of respective channels), increasing the number of inverters of the inverter stages 702 that are operatively coupled in the programmable inverter 700 increases the drivability of the programmable inverter 700, and conversely, reducing the number of inverters of the inverter stages 702 that are operatively coupled in the programmable inverter 700 reduces the drivability of the programmable inverter 700.

Referring back to FIG. 6, in operation, a clock signal (Clk0) is input on the tap-0 node 604-0 of the clock driver circuit 600. This clock signal is propagated through the serially connected buffers 602-1 through 602-7. Latency of the clock signal propagating through a buffer causes the clock signal output by that buffer to be delayed. Hence, the clock signal (Clk1) output by the buffer 602-1 on the tap-1 node 604-1 is once delayed. The clock signal (Clk2) output by the buffer 602-2 on the tap-2 node 604-2 is twice delayed. The clock signal (Clk3) output by the buffer 602-3 on the tap-3 node 604-3 is three times delayed. The clock signal (Clk4) output by the buffer 602-4 on the tap-4 node 604-4 is four times delayed. The clock signal (Clk5) output by the buffer 602-5 on the tap-5 node 604-5 is five times delayed. The clock signal (Clk6) output by the buffer 602-6 on the tap-6 node 604-6 is six times delayed. The clock signal (Clk7) output by the buffer 602-7 on the tap-7 node 604-7 is seven times delayed.

The various clock signal are input to respective inverters 610-0 through 610-6 and 620-1 through 620-7, which invert the clock signals and output the inverted clock signals to the respective multiplexers 612, 622. The multiplexer 612 selectively outputs a clock signal with an even multiple of a delay (e.g., clock signals (Clk0, Clk2, Clk4, Clk6)) based on a digital value programmed or written to a memory element that is provided to the select control nodes of the multiplexer 612. The multiplexer 622 selectively outputs a clock signal with an odd multiple of a delay (e.g., clock signals (Clk1, Clk3, Clk5, Clk7)) based on a digital value programmed or written to a memory element that is provided to the select control nodes of the multiplexer 622. Generally, although different in some instances, the clock signals output by the multiplexers 612, 622 have a difference of delay of one delay (e.g., delay incurred as a result of propagating through one buffer). For example, if inverted clock signal (Clk4) that is four times delayed is selectively output from the multiplexer 612, inverted clock signal (Clk3) that is three times delayed or inverted clock signal (Clk5) that is five times delayed generally will be output from the multiplexer 622.

The inverted clock signals output from the multiplexers 612, 622 are input into respective programmable inverters 614, 624. The clock signal output from the programmable inverters 614, 624 to the input node of the inverter 630 is based on a drivability of each of the programmable inverters 614, 624. For clarity of explanation herein, the clock signal output by the multiplexer 612 has a phase difference $\theta_{EVEN}$ with respect to the phase of the clock signal (Clk0) input into the clock driver circuit 600, and the clock signal output by the multiplexer 622 has a phase difference $\theta_{ODD}$ with respect to the phase of the clock signal (Clk0). Further, the programmable inverter 612 has a drive strength $D_{EVEN}$, and the programmable inverter 622 has a drive strength $D_{ODD}$. The resulting clock signal input to the inverter 630 has a phase difference $\theta_{deskew}$ with respect to the phase of the clock signal (Clk0). The phase difference $\theta_{deskew}$ is generally a sum of (i) a product of the (a) a ratio of the drive strength $D_{EVEN}$ to a sum of the drive strength $D_{EVEN}$ and drive strength $D_{ODD}$ and (b) the phase difference $\theta_{EVEN}$, and (ii) a product of the (a) a ratio of the drive strength $D_{ODD}$ to the sum of the drive strength $D_{EVEN}$ and drive strength $D_{ODD}$ and (b) the phase difference $\theta_{ODD}$. This is restated mathematically below:

$$\theta_{deskew} = \frac{D_{EVEN}}{D_{EVEN}+D_{ODD}}\theta_{EVEN} + \frac{D_{ODD}}{D_{EVEN}+D_{ODD}}\theta_{ODD}$$

The resulting clock signal is passed through the inverters 630, 632, which act as a buffer circuit, and is input into the duty cycle adjustment stage. As can be seen by the foregoing description, by programmatically selecting which clock signals are output from the multiplexers 612, 622, the phase differences $\theta_{EVEN}$, $\theta_{ODD}$ can be programmatically selected, and by programmatically operatively coupling inverter stages in the programmable inverters 614, 624, the drivability and drive strengths $D_{EVEN}$ $D_{ODD}$ can be programmatically selected. Hence, the resulting phase difference $\theta_{deskew}$ of the clock signal output from the deskew stage of the clock driver circuit 600 can be programmatically selected.

In the illustrated example, the multiplexers 612, 622, programmable inverters 614, 624, and inverters 630, 632 form and/or are included in a complementary metal-oxide-semiconductor based (CMOS-based) phase interpolator. Being CMOS-based permits the phase interpolator to be power efficient and consume low power.

The duty cycle adjustment stage of the clock driver circuit 600 includes p-type transistors 502, 504 and n-type transistors 506, 508 like described above with respect to FIG. 5. The duty cycle adjustment stage (e.g., the p-type transistors 502, 504 and n-type transistors 506, 508) is configured to adjust a duty cycle of a clock signal like described above with respect to FIG. 5, and hence, detailed description of the duty cycle adjustment stage in FIG. 6 is omitted for brevity.

The clock driver circuit 600 can include additional components in other examples. For example, clock driver circuit 600 can include an additional inverter that can have an input node electrically connected to the drains of the p-type transistor 504 and the n-type transistor 506 and an output node electrically connected to the output node 512 (e.g., the inverter can be electrically connected between the drains and the output node 512). In such an example, a single-ended output clock signal can generally logically correspond to the single-ended input clock signal (Clkin) (e.g., not be a logical complement of the single-ended input clock signal (Clkin)), possibly with an adjusted duty cycle.

Figure 8:
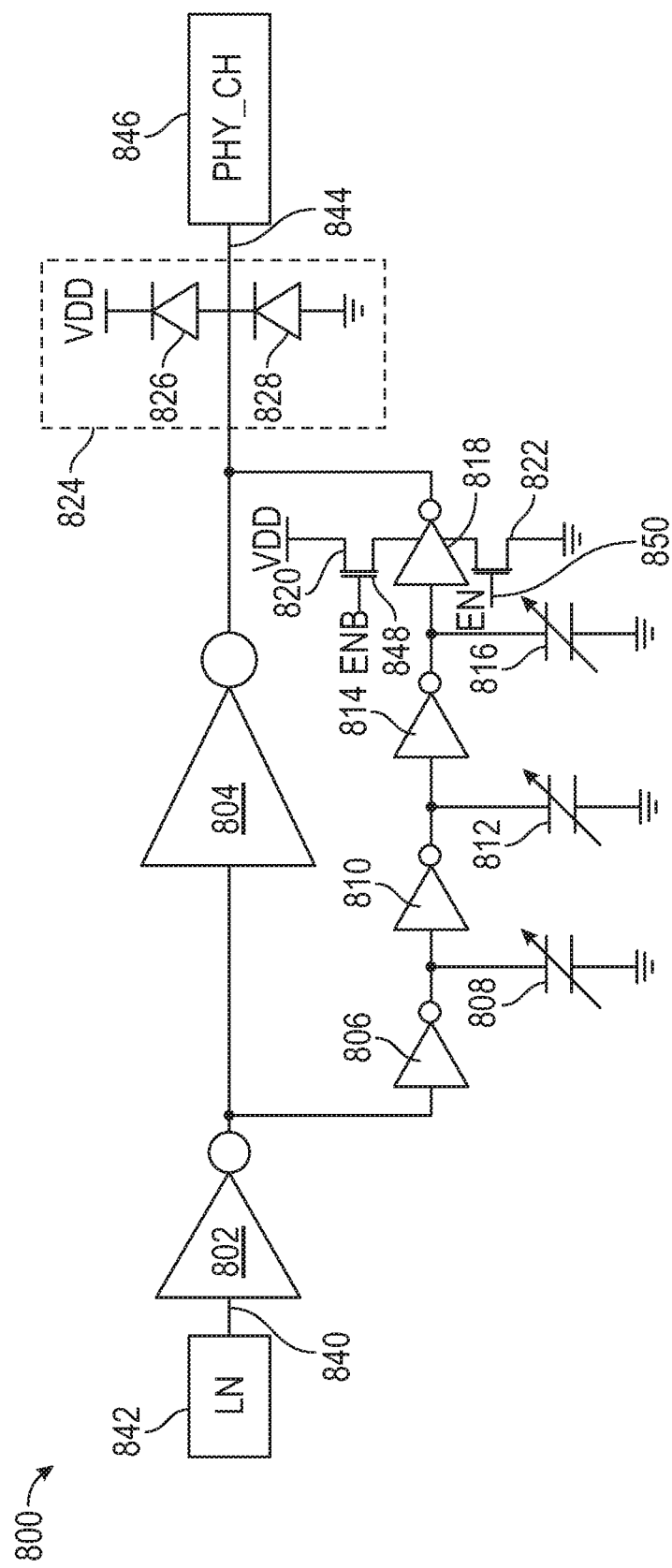
FIG. 8 is a circuit schematic of a signal driver circuit according to some examples.

FIG. 8 is a circuit schematic of a signal driver circuit 800 according to some examples. The signal driver circuits 428 in FIG. 4A can include an instance of the signal driver circuit 800 for each physical channel of the physical channels 204-12 that is driven by the signal driver circuits 428. The signal driver circuit 800 is configurable to provide equalization to a signal to offset, e.g., varying attenuation of the signal at different frequencies through the corresponding physical channel.

The signal driver circuit 800 includes inverters 802, 804, 806, 810, 814, 818, programmable impedance circuits 808, 812, 816, a p-type transistor 820, an n-type transistor 822, and an electrostatic discharge (ESD) protection circuit 824. An input node of the inverter 802, which is the input node 840 of the signal driver circuit 800, is electrically connected to a lane 842 (e.g., a data lane). The signal driver circuit 800 includes a primary path and a feedforward path from an output node of the inverter 802 to an output node 844 of the signal driver circuit 800, which is electrically connected to a physical channel 846 (e.g., a physical channel of the physical channels 204-12). The primary path includes the inverter 804. An input node of the inverter 804 is electrically connected to the output node of the inverter 802, and an output node of the inverter 804 is electrically connected to the output node 844 of the signal driver circuit 800.

The feedforward path includes inverters 806, 810, 814, 818 and programmable impedance circuits 808, 812, 816. An input node of the inverter 806 is electrically connected to the output node of the inverter 802. An output node of the inverter 806 is electrically connected to a first terminal of the programmable impedance circuit 808 and an input node of the inverter 810. An output node of the inverter 810 is electrically connected to a first terminal of the programmable impedance circuit 812 and an input node of the inverter 814. An output node of the inverter 814 is electrically connected to a first terminal of the programmable impedance circuit 816 and an input node of the inverter 818. An output node of the inverter 818 is electrically connected to the output node 844 of the signal driver circuit 800. Respective second terminals (opposite from the first terminal) of the programmable impedance circuits 808, 812, 816 are electrically connected to a second power supply node (e.g., a ground node).

The p-type transistor 820 is electrically connected between a first power supply node (e.g., a VDD power supply node) and a power input node of the inverter 818, and the n-type transistor 822 is electrically connected between another power input node of the inverter 818 and a second power supply node (e.g., a ground node). A source node of the p-type transistor 820 is electrically connected to the first power supply node (e.g., a VDD power supply node), and a drain node of the p-type transistor 820 is electrically connected to the power input node of the inverter 818. The other power input node of the inverter 818 is electrically connected to a drain node of the n-type transistor 822. A source node of the n-type transistor 822 is electrically connected to the second power supply node (e.g., a ground node). A gate node of the p-type transistor 820 is electrically connected to a complementary enable node (ENB) 848, and a gate node of the n-type transistor 822 is electrically connected to an enable node (EN) 850.

In some examples, the enable node (EN) 850 is electrically coupled to a memory element (e.g., a register, eFuse, or other memory) that is programmable. The memory element can be programmed or written with a digital value that is logically high or logically low, and that logically high or logically low value is applied on the enable node (EN) 850. An inverter can be electrically coupled between the memory element and the complementary enable node (ENB) 848 to logically complement the value programmed or written to the memory element, which logically complemented value is applied to the complementary enable node (ENB) 848.

The inverter 818 can be selectively operatively coupled between the power supply nodes based on the values written to the memory elements. When the signal on the enable node (EN) 850 is logically high (e.g., the power supply voltage VDD) and the signal on the complementary enable node (ENB) 848 is correspondingly logically low (e.g., a ground potential), the p-type transistor 820 and the n-type transistor 822 are in conductive states, which causes the inverter 818 to be operatively coupled between the power supply nodes. Conversely, when the signal on the enable node (EN) 850 is logically low and the signal on the complementary enable node (ENB) 848 is correspondingly logically high, the p-type transistor 820 and the n-type transistor 822 are in non-conductive or open states, which causes the inverter 818 to be operatively decoupled from the power supply nodes.

Operatively decoupling the inverter 818 in the feedforward path turns off equalization in the signal driver circuit 800. When operatively coupled, the inverter 818 provides a current at the output node 844 that is summed with a current output by the inverter 804. In the illustrated example, the feedforward path is configured to be subtractive such that the current output from the inverter 818 inverted and is effectively subtracted from the current output by the inverter 804. In the illustrated example, the inverters 806, 810, 814, 818 in the feedforward path are configured to generate an opposite polarity of a signal of the primary path. In some examples, the feedforward path is configured to be additive such that the current output from the inverter 818 not logically inverted and is added to the current output by the inverter 804. By operatively decoupling the inverter 818 from between the power supply nodes, no current is generally output from the inverter 818 resulting in generally no equalization being provided by the feedforward path.

When the inverter 818 is operatively coupled, the signal driver circuit 800 can provide a sub-UI type of equalization. In the illustrated example, the feedforward path can create an inversion with respect to the primary path. The feedforward path generates a delay difference with respect to the primary path, which may be equal to 1 UI, where 1 UI is the inverse of the data rate of data through the signal driver circuit 800. In this manner, low frequency components of the signal at the output node 844 can be attenuated while high frequency components of the signal at the output node 844 can be amplified. The programmable impedance circuits 808, 812, 816 permit tuning the delay introduced by the feedforward path, such as to approach 1 UI, where equalization may be more effective. The signal driver circuit 800, when the inverter 818 is operatively coupled between the power supply nodes, can implement a finite impulse response (FIR) filter.

Additionally, the ESD protection circuit 824 is electrically connected at the output node 844. The ESD protection circuit 824 includes diodes 826, 828. The diode 826 has a cathode electrically connected to the first power supply node (e.g., a VDD power supply node) and an anode electrically connected to the output node 844. The diode 828 has a cathode electrically connected to the output node 844 and an anode electrically connected to the second power supply node (e.g., a ground node).

Figure 9:
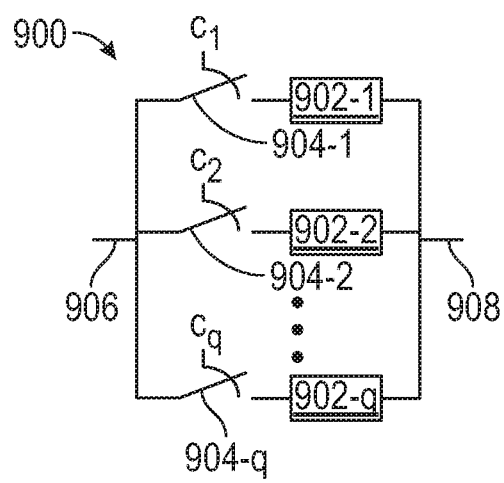
FIG. 9 is a circuit schematic of an impedance array according to some examples.

FIG. 9 is a circuit schematic of an impedance array 900 according to some examples. The impedance array 900 includes q number of impedance elements 902-1, 902-2 to 902-$q$ (individually or collectively, impedance element(s) 902) and q number of switches 904-1, 904-2 to 904-$q$ (individually or collectively, switch(es) 904). An impedance element 902 is electrically connected in series with a corresponding switch 904. The serially connected pairs of the impedance element 902 and switch 904 are electrically connected in parallel between a first terminal 906 of the impedance array 900 and a second terminal 908 of the impedance array 900.

Each switch 904 further has a control ($C_x$) node, where x is the indication of the corresponding switch 904 (e.g., x is 1 for switch 904-1). Each switch 904 is configured to be selectively opened or closed based on a signal received at the control ($C_x$) node. Each switch 904 can be a transistor (e.g., a p-type or n-type transistor), a transmission gate, or other switch. Each impedance element 902 can be or include a resistor, a capacitor, an inductor, or any combination or permutation thereof.

The impedance array 900 is configured to selectively electrically connect or disconnect impedance elements in parallel based on the state (e.g., open or closed) of the switches 904. The impedance array 900 is programmable. In some examples, a control signal ($C_x$) can be stored in a memory element (e.g., a register, eFuse, or other memory). An output node of the memory element can be electrically coupled to a respective control ($C_x$) node to provide the control signal ($C_x$) to the control ($C_x$) node to control the state of the corresponding switch 904.

Figure 10:
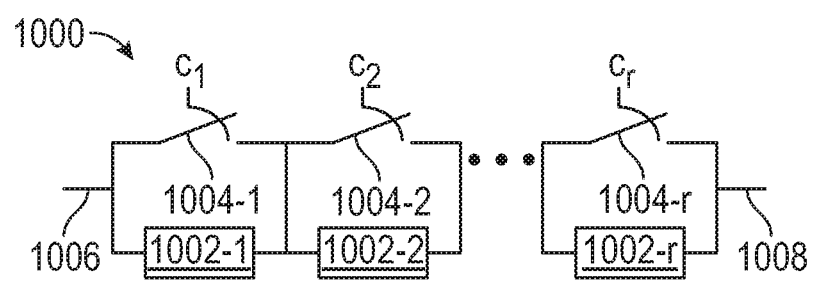
FIG. 10 is a circuit schematic of an impedance array according to some examples.

FIG. 10 is a circuit schematic of an impedance array 1000 according to some examples. The impedance array 1000 includes r number of impedance elements 1002-1, 1002-2 to 1002-r (individually or collectively, impedance element(s) 1002) and r number of switches 1004-1, 1004-2 to 1004-r (individually or collectively, switch(es) 1004). An impedance element 1002 is electrically connected in parallel with a corresponding switch 1004. The parallel-connected pairs of the impedance element 1002 and switch 1004 are electrically connected in series between a first terminal 1006 of the impedance array 1000 and a second terminal 1008 of the impedance array 1000.

Each switch 1004 further has a control ($C_x$) node, where x is the indication of the corresponding switch 1004 (e.g., x is 1 for switch 1004-1). Each switch 1004 is configured to be selectively opened or closed based on a signal received at the control ($C_x$) node. Each switch 1004 can be a transistor (e.g., a p-type or n-type transistor), a transmission gate, or other switch. Each impedance element 1002 can be or include a resistor, a capacitor, an inductor, or any combination or permutation thereof.

The impedance array 1000 is configured to selectively electrically connect or disconnect impedance elements in series based on the state (e.g., open or closed) of the switches 1004. When a switch 1004 is open, the corresponding impedance element 1002 of the parallel-connected pair is electrically coupled in series with any other impedance element in the impedance array 1000. When a switch 1004 is closed, the corresponding impedance element 1002 of the parallel-connected pair is electrically shorted and bypassed by the closed switch 1004, and hence, that impedance element 1002 is not coupled in series with any other impedance element in the impedance array 1000. The impedance array 1000 is programmable. In some examples, a control signal ($C_x$) can be stored in a storage element, such as memory, a register, or the like. An output node of the storage element can be electrically coupled to a respective control ($C_x$) node to provide the control signal ($C_x$) to the control ($C_x$) node to control the state of the corresponding switch 1004.

The impedance arrays 900, 1000 of FIGS. 9 and 10, in any configuration, arrangement, or permutation together or individually, can be implemented as any or each of the programmable impedance circuits 808, 812, 816 of FIG. 8. Hence, the programmable impedance circuits 808, 812, 816 can be programmable to achieve a number of impedances, which permits the signal driver circuit 800 to be programmable to achieve a number of different delays for equalization.

According to some examples, the structure of the WLFO package 100 and the IC dies 102 (and circuits therein) are co-designed, which can achieve high bandwidth density and high power efficiency. In a particular example, the WLFO package 100 is an InFO package. Single-ended source synchronous data links (e.g., physical channels) operating at 13.25 Gbps are connected through a redistribution structure 110 of the InFO package. Taking advantage of fine dimensions of the InFO packaging technology (e.g., 2 μm metal line width, 2 μm spacing between neighboring metal lines, and 4 μm pitches of neighboring metal lines), aggregated throughput can be 2.53 Tbps over 2.5 mm along the lateral sidewalls 152-1, 152-2 of the IC dies 102-1, 102-2, and hence, a high bandwidth density of 1 Tbps/mm or greater can be achieved. In some examples, a high bandwidth density of 2 Tbps/mm or greater can be achieved. Co-designing the IC dies and the WLFO package 100 can provide additional degrees of freedom. For example, metal line spacing and shielding (e.g., as illustrated in FIG. 3) can be implemented to reduce cross-talk noise and to improve received signal signal-to-noise ratio (SNR), while attaining 0.13 pJ/bit or better power efficiency.

In some examples, a single-ended signaling scheme (e.g., single-ended NRZ signaling scheme) is implemented for transmitting data signals between transceiver circuits 202 on different IC dies 102. A single-ended NRZ signaling scheme can have a high pin efficiency and low power requirement. The single-ended NRZ signaling scheme can be at least partly enabled by co-designing the IC dies 102 and the WLFO package 100, which allows channel characteristics (e.g., cross-talk) and electrical performance to be considered and addressed together. In some examples, a supply voltage (e.g., supply voltage VDD) is chosen to be 0.65 V, which can reduce power consumption while achieving a bit error rate (BER) of $1 \times 10^{-12}$.

Various examples implement source synchronous transceivers. Transmitter circuits (e.g., transmitter circuit 202-1T) transmit clock signals that the corresponding receiver circuits (e.g., receiver circuit 202-1R) uses to capture data transmitted from the respective transmitter circuit and received by the receiver circuit. The data can be transmitted as respective single-ended signals, as noted above, and the clock signals can be transmitted as differential signals. The received clock signal can be used, after optionally deskewing, to capture the data. A receiver circuit can capture data from data signals on multiple physical channels using a single clock signal. In the illustrated example of FIGS. 4A and 4B, one clock signal is used to capture data from sixteen physical channels, as described above. Hence, in the illustrated example, a data lane to clock signal ratio is 16:1. Forwarding clock signals in this way can simplify the design of clock generation in receiver circuits and can improve power efficiency. A high data lane to clock ratio can minimize the number of clock signals to be forwarded from a transmitter circuit to a receiver circuit, which can improve bandwidth density and power efficiency.

In some instances, a high clock sharing ratio can degrade a horizontal eye margin. Hence, in such instances, low clock and data skew may be desirable. To reduce such skew, characteristics of the physical channels through the redistribution structure of the WLFO package can be well-matched. For example, metal line lengths of physical channels that transmit data signals that shares a clock signal can be substantially equal to the metal line lengths of the physical channels that transmit the clock signal. If, for example, the metal line lengths are not well-matched, a clock signal or the data signal can incur more latency in transmission, such as due to a larger resistance-capacitance (RC) time constant of the metal lines, that can create a larger skew. Such matching can illustrate another reason for IC die and WLFO package co-designing.

In some examples, clock signals used in the receiver circuit to capture data may need to be tuned to capture data at a relatively large eye opening. To tune a clock signal, the clock driver circuit 600 can be implemented. In some examples, the clock driver circuit 600 implements a CMOS-based phase interpolator, which may be power efficient, such as 0.018 pJ/bit, and may easily scale with frequency. The CMOS-based phase interpolator can have a step size of approximately 3 ps. Additionally, duty cycle distortion of a clock signal can be corrected or adjusted for better eye margin. In some examples, the clock driver circuit 600 can have a correction range of approximately 3 ps for both rising edges and falling edges.

In some instances, it may be desirable to operate each physical channel on which data is transmitted at a highest possible data rate to maximize bandwidth density, provided doing so is within a given power constraint. Hence, in some examples, a transmitter circuit implements the signal driver circuit 800 of FIG. 8 with equalization selectively enabled. Performing the equalization can equalize channel loss, and, in some instances, can enable a data rate of 13.25 Gbps at the expense of 0.01 pJ/bit. Performing the equalization was found to increase margins of eye openings at the receiver circuit.

Various components of examples described above have been described as being programmable. In some examples, the transceiver circuits implemented in a WLFO package are not programmable. In other examples that implement various programmable components, such components can be programmed once or may be programmed multiple times. For example, channel characteristics of the WLFO package are largely static once the WLFO package has been manufactured. Once manufactured, tests can be performed, and appropriate memory elements can be programmed based on results of the tests, e.g., to achieve clock signals with appropriate duty cycles and/or skew and/or to implement appropriate equalization. The memory elements can be, e.g., eFuses that can be blown to program the memory element. Since the channel characteristics are largely static, the eFuses can be blown once to achieve appropriate functionality of the WLFO package. In other examples, the channel characteristics may vary over the lifetime of the WLFO package, such as due to process-voltage-temperature (PVT) variation. In such instances, the IC dies can implement a processor or controller that can implement an adaptation algorithm, e.g., based on a PVT monitor, BER, or any other basis, that is capable of dynamically programming the memory elements. In such examples, the memory elements can be, e.g., static random access memory (SRAM) or another latch circuit.

Figure 11:
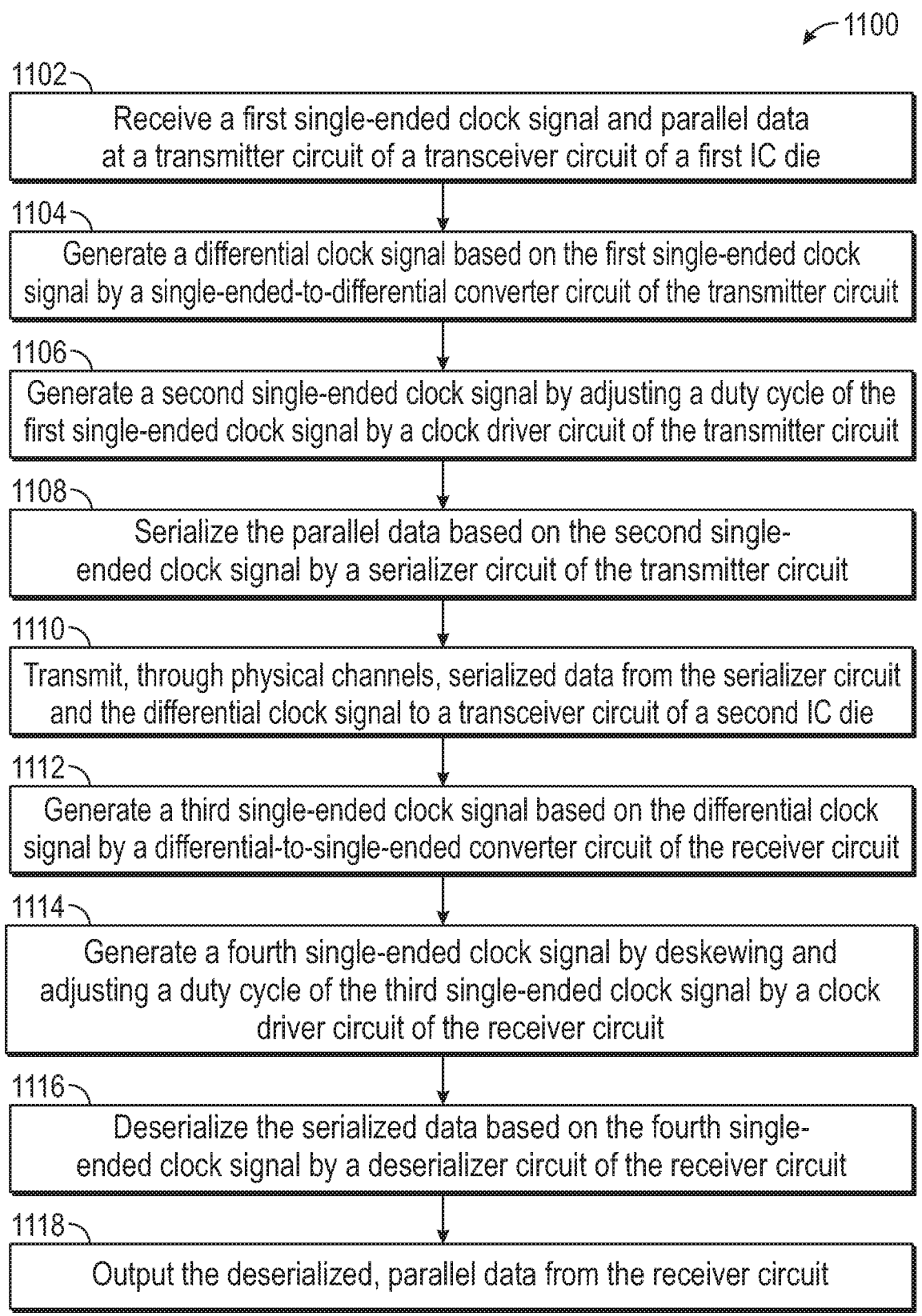
FIG. 11 is a flowchart of a method for operating an electronic device according to some examples.

FIG. 11 is a flowchart of a method 1100 for operating an electronic device according to some examples. The method 1100 is described in the context of the examples and figures described above, particularly FIGS. 4A and 4B. A subset of the functionality of the examples and figures described above is described with respect to the method 1100, and a person having ordinary skill in the art will readily understand the applicability of the method 1100 to each full example. Although the description below in the context of FIGS. 4A and 4B is provided from the perspective of the transmitter circuit 202-1T in the transceiver circuit 202-1 transmitting data signals to the receiver circuit 202-2R in the transceiver circuit 202-2, it is to be understood that the transceiver circuit 202-1 can include a receiver circuit 202-1R, and the transceiver circuit 202-2 can include a transmitter circuit 202-2T, where the transmitter circuit 202-2T transmits data signals to the receiver circuit 202-1R.

At block 1102, a first single-ended clock signal and parallel data are received at a transmitter circuit of a transceiver circuit of a first IC die. For example, parallel data is received at buffer circuits 402 of the transmitter circuit 202-1T, and a single-ended clock signal is received at a clock driver circuit 406 of the transmitter circuit 202-1T.

At block 1104, a differential clock signal is generated based on the first single-ended clock signal by a single-ended-to-differential converter circuit of the transmitter circuit. For example, the S2D converter circuit 412-1 generates a differential clock signal based on the single-ended clock signal received at the clock driver circuit 406.

At block 1106, optionally, a second single-ended clock signal is generated by adjusting a duty cycle of the first single-ended clock signal by a clock driver circuit of the transmitter circuit. For example, the clock driver circuit 414-1 can adjust a duty cycle of the single-ended clock signal from the clock driver circuit 406. In other examples, the clock driver circuit 414-1 buffers the single-ended clock signal received at the clock driver circuit 406 without adjusting a duty cycle.

At block 1108, the parallel data is serialized based on the second single-ended clock signal by a serializer circuit of the transmitter circuit. For example, the serializer circuit 410-1 serializes parallel data received from the buffer circuits 402 based on the single-ended clock signal generated by the clock driver circuit 414-1.

At block 1110, serialized data from the serializer circuit and the differential clock signal are transmitted, through physical channels, to a transceiver circuit of a second IC die. For example, the serialized data output by the serializer circuit 410-1 and the differential clock signal output by the S2D converter circuit 412-1 are transmitted by signal driver circuits 428 through physical channels 204-12 to the transceiver circuit 202-2. The signal driver circuits 428 can drive the serialized data (e.g., as single-ended data signals) and the differential clock signal on the physical channels. The signal driver circuits 428 can also equalize the single-ended data signals and differential clock signals.

At block 1112, a third single-ended clock signal is generated based on the differential clock signal by a differential-to-single-ended converter circuit of the receiver circuit. For example, the D2S converter circuit 452-1 receives the differential clock signal generated by the S2D converter circuit 412-1 and generates a single-ended clock signal based on the differential clock signal.

At block 1114, optionally, a fourth single-ended clock signal is generated by deskewing and adjusting a duty cycle of the third single-ended clock signal by a clock driver circuit of the receiver circuit. For example, the clock driver circuit 454-1 can generate a single-ended clock signal by deskewing and adjusting a duty cycle of the single-ended clock signal generated by the D2S converter circuit 452-1. In other examples, the clock driver circuit 454-1 buffers the single-ended clock signal generated by the D2S converter circuit 452-1 without desking and/or adjusting a duty cycle.

At block 1116, the serialized data is captured and deserialized based on the fourth single-ended clock signal by a deserializer circuit of the receiver circuit. For example, the deserializer circuit 450-1 captures, from the data signals on the physical channels 204-12, the serialized data serialized by the serializer circuit 410-1 and deserializes the data based on the single-ended clock signal generated by the clock driver circuit 454-1.

At block 1118, the deserialized, parallel data is output from the receiver circuit. For example, deserialized, parallel data from the deserializer circuit 450-1 is output from the receiver circuit 202-2R via the buffer circuits 458, 470.

Other functionality of examples, as well as structure of examples, are described above, and a person having ordinary skill in the art will readily understand such functionality and structure from the foregoing.

While the foregoing is directed to specific examples, other and further examples may be devised without departing from the basic scope thereof, and the scope thereof is determined by the claims that follow.

What is claimed is:

1. An electronic device comprising:
    a wafer-level fan-out package comprising:
        a first integrated circuit (IC) die comprising a transmitter circuit, the transmitter circuit comprising a serializer circuit configured to receive parallel data, serialize the parallel data, and output serialized data, the transmitter circuit being configured to transmit the serialized data as multiple single-ended data signals;
        a second IC die comprising a receiver circuit; and
        a redistribution structure comprising physical channels electrically connected to and between the transmitter circuit and the receiver circuit, the transmitter circuit being configured to transmit the multiple single-ended data signals and a differential clock signal through the physical channels to the receiver circuit, the receiver circuit being configured to capture data from the multiple single-ended data signals using a first single-ended clock signal based on the differential clock signal.

2. The electronic device of claim 1, wherein the transmitter circuit comprises a single-ended-to-differential converter circuit configured to generate the differential clock signal based on a second single-ended clock signal, and the serializer circuit is configured to serialize the parallel data based on a third single-ended clock signal that is or is based on the second single-ended clock signal.

3. The electronic device of claim 2, wherein the transmitter circuit comprises a clock driver circuit configured to generate the third single-ended clock signal by adjusting a duty cycle of the second single-ended clock signal.

4. The electronic device of claim 1, wherein the transmitter circuit comprises signal driver circuits configured to drive the multiple single-ended data signals and the differential clock signal on the physical channels.

5. The electronic device of claim 4, wherein respective ones of the signal driver circuits are configured to equalize the multiple single-ended data signals.

6. The electronic device of claim 4, wherein the respective ones of the signal driver circuits each comprise:
    a primary path electrically connected between a first node and a driver output node, the primary path comprising a first inverter; and
    a secondary path electrically connected between the first node and the driver output node, the secondary path comprising second inverters and an impedance circuit, the second inverters being configured to generate an opposite polarity of a signal of the primary path.

7. The electronic device of claim 6, wherein:
    the impedance circuit is programmable; and
    at least one of the second inverters is configured to be programmatically selectively operatively coupled in the secondary path.

8. The electronic device of claim 1, wherein the receiver circuit comprises:
    a differential-to-single-ended converter circuit configured to generate a second single-ended clock signal based on the differential clock signal; and
    a deserializer circuit configured to receive at least some of the multiple single-ended data signals and deserialize data from the at least some of the multiple single-ended data signals based on the first single-ended clock signal that is or is based on the second single-ended clock signal.

9. The electronic device of claim 8, wherein the receiver circuit comprises a clock driver circuit configured to generate the first single-ended clock signal by deskewing the second single-ended clock signal and adjusting a duty cycle of the second single-ended clock signal.

10. An electronic device comprising:
    a wafer-level fan-out package comprising:
        a first integrated circuit (IC) die comprising a transmitter circuit;
        a second IC die comprising a receiver circuit; and
        a redistribution structure comprising physical channels electrically connected to and between the transmitter circuit and the receiver circuit, the transmitter circuit being configured to transmit multiple single-ended data signals and a differential clock signal through the physical channels to the receiver circuit, the receiver circuit being configured to capture data from the multiple single-ended data signals using a first single-ended clock signal based on the differential clock signal, wherein the physical channels include channel metal lines in the redistribution structure, the channel metal lines being disposed alternatingly with shield metal lines in the redistribution structure.

11. An electronic device comprising:
    a first transceiver circuit in a first integrated circuit (IC) die, the first IC die being disposed in a wafer-level fan-out package;
    a second transceiver circuit in a second IC die, the second IC die being disposed in the wafer-level fan-out package; and
    physical channels in a redistribution structure of the wafer-level fan-out package, wherein:
        the first transceiver circuit is configured to transmit multiple first single-ended data signals and a first differential clock signal through a first subset of the physical channels to the second transceiver circuit;
        the second transceiver circuit is configured to transmit multiple second single-ended data signals and a second differential clock signal through a second subset of the physical channels to the first transceiver circuit;
        the second transceiver circuit is configured to capture data from the multiple first single-ended data signals using a first single-ended clock signal based on the first differential clock signal; and
        the first transceiver circuit is configured to capture data from the multiple second single-ended data signals using a second single-ended clock signal based on the second differential clock signal.

12. The electronic device of claim 11, wherein the physical channels include channel metal lines in the redistribution structure and disposed laterally between the first IC die and the second IC die, the channel metal lines being disposed alternatingly with shield metal lines in the redistribution structure.

13. The electronic device of claim 11, wherein:
the first transceiver circuit comprises:
a first single-ended-to-differential converter circuit configured to generate the first differential clock signal based on a third single-ended clock signal; and
a first serializer circuit configured to receive first parallel data, serialize the first parallel data based on a fourth single-ended clock signal that is or is based on the third single-ended clock signal, and output first serialized data, the first transceiver circuit being configured to transmit the first serialized data as the multiple first single-ended data signals;
a first differential-to-single-ended converter circuit configured to generate a fifth single-ended clock signal based on the second differential clock signal; and
a first deserializer circuit configured to deserialize data from the multiple second single-ended data signals based on the second single-ended clock signal that is or is based on the fifth single-ended clock signal; and
the second transceiver circuit comprises:
a second single-ended-to-differential converter circuit configured to generate the second differential clock signal based on a sixth single-ended clock signal; and
a second serializer circuit configured to receive second parallel data, serialize the second parallel data based on a seventh single-ended clock signal that is or is based on the sixth single-ended clock signal, and output second serialized data, the second transceiver circuit being configured to transmit the second serialized data as the multiple second single-ended data signals;
a second differential-to-single-ended converter circuit configured to generate an eighth single-ended clock signal based on the first differential clock signal; and
a second deserializer circuit configured to deserialize data from the multiple first single-ended data signals based on the first single-ended clock signal that is or is based on the eighth single-ended clock signal.

14. The electronic device of claim 13, wherein:
the first transceiver circuit comprises:
a first clock driver circuit configured to generate the fourth single-ended clock signal by adjusting a duty cycle of the third single-ended clock signal; and
a second clock driver circuit configured to generate the second single-ended clock signal by deskewing the fifth single-ended clock signal and adjusting a duty cycle of the fifth single-ended clock signal; and
the second transceiver circuit comprises:
a third clock driver circuit configured to generate the seventh single-ended clock signal by adjusting a duty cycle of the sixth single-ended clock signal; and
a fourth clock driver circuit configured to generate the first single-ended clock signal by deskewing the eighth single-ended clock signal and adjusting a duty cycle of the eighth single-ended clock signal.

15. The electronic device of claim 11, wherein:
the first transceiver circuit comprises first signal driver circuits configured to drive the multiple first single-ended data signals and the first differential clock signal on the first subset of the physical channels, the first signal driver circuits being configured to equalize the multiple first single-ended data signals; and
the second transceiver circuit comprises second signal driver circuits configured to drive the multiple second single-ended data signals and the second differential clock signal on the second subset of the physical channels, the second signal driver circuits being configured to equalize the multiple second single-ended data signals.

16. A method of operating an electronic device, the method comprising:
generating a differential clock signal based on a first single-ended clock signal by a single-ended-to-differential converter circuit of a first transceiver circuit of a first integrated circuit (IC) die, the first IC die being disposed in a wafer-level fan-out package;
serializing parallel data based on the first single-ended clock signal by a serializer circuit of the first transceiver circuit;
transmitting, through physical channels of the wafer-level fan-out package, serialized data from the serializer circuit and the differential clock signal to a second transceiver circuit of a second IC die, the second IC die being disposed in the wafer-level fan-out package; and
deserializing the serialized data based on the differential clock signal by a deserializer circuit of the second transceiver circuit.

17. The method of claim 16 further comprising generating a second single-ended clock signal comprising adjusting a duty cycle of the first single-ended clock signal, serializing the parallel data being based on the second single-ended clock signal.

18. The method of claim 16 further comprising:
generating a second single-ended clock signal based on the differential clock signal by a differential-to-single-ended converter circuit of the second transceiver circuit;
deskewing the second single-ended clock signal to generate a deskewed single-ended clock signal by a clock driver circuit of the second transceiver circuit; and
adjusting a duty cycle of the deskewed single-ended clock signal to generate a third single-ended clock signal by the clock driver circuit, deserializing the serialized data being based on the third single-ended clock signal.

19. The method of claim 16 further comprising equalizing signals of the serialized data by a signal driver circuit of the first transceiver circuit.

20. The method of claim 16, wherein the physical channels include channel metal lines in a redistribution structure of the wafer-level fan-out package and disposed laterally between the first IC die and the second IC die, the channel metal lines being disposed alternatingly with shield metal lines in the redistribution structure.

* * * * *